United States Patent
Kanehira et al.

(10) Patent No.: US 6,212,671 B1
(45) Date of Patent: Apr. 3, 2001

(54) MASK PATTERN DATA PRODUCING APPARATUS, MASK PATTERN DATA PRODUCING METHOD AND SEMICONDUCTOR INTEGRATED CIRCUIT DEVICE

(75) Inventors: Yusuke Kanehira; Takao Satoh, both of Tokyo; Nobuhide Naritomi, Hyogo, all of (JP)

(73) Assignees: Mitsubishi Electric System LSI Design Corporation, Hyogo; Mitsubishi Denki Kabushiki Kaisha, Tokyo, both of (JP)

( * ) Notice: Subject to any disclaimer, the term of this patent is extended or adjusted under 35 U.S.C. 154(b) by 0 days.

(21) Appl. No.: 09/085,169

(22) Filed: May 28, 1998

(30) Foreign Application Priority Data

Oct. 20, 1997 (JP) .................................................. 9-287160

(51) Int. Cl.[7] ...................................................... G06F 17/50
(52) U.S. Cl. ............................................... 716/19; 716/20
(58) Field of Search ........................................ 716/19, 20

(56) References Cited

U.S. PATENT DOCUMENTS

| 3,584,269 | * | 6/1971 | Thun | 257/539 |
|---|---|---|---|---|
| 5,275,962 | * | 1/1994 | Hashimoto | 438/130 |
| 5,331,191 | * | 7/1994 | Sugiura et al. | 257/336 |
| 5,346,834 | * | 9/1994 | Hisamoto et al. | 438/152 |
| 5,477,067 | * | 12/1995 | Isomura et al. | 257/211 |
| 5,580,807 | * | 12/1996 | Sery et al. | 438/128 |
| 5,589,415 | * | 12/1996 | Blanchard | 438/128 |
| 5,840,619 | * | 11/1998 | Hayashide | 438/598 |
| 5,880,020 | * | 3/1999 | Mano | 438/618 |
| 5,903,036 | * | 5/1999 | Onozawa | 257/390 |
| 5,981,369 | * | 11/1999 | Yoshida et al. | 438/597 |
| 6,020,226 | * | 2/2000 | Cerny et al. | 438/167 |
| 6,025,252 | * | 2/2000 | Shindo et al. | 438/509 |

FOREIGN PATENT DOCUMENTS

| 5-82640 | 2/1993 | (JP) . |
| 8-166977 | 6/1996 | (JP) . |
| 9-22985 | 1/1997 | (JP) . |

\* cited by examiner

Primary Examiner—Kevin J. Teska
Assistant Examiner—Hugh Jones
(74) Attorney, Agent, or Firm—McDermott, Will & Emery

(57) ABSTRACT

A well wall of a second type of conduction is formed so as to surround a first IC formed in a first IC forming region specified by a region specifying means and to extend from a surface of a semiconductor substrate to a bottom well on the basis of information about the first IC forming region and information about the bottom well in a mask pattern produced by a bottom well mask pattern producing means.

13 Claims, 12 Drawing Sheets

MASK PATTERN DATA PRODUCING APPARATUS, MASK PATTERN DATA PRODUCING METHOD AND SEMICONDUCTOR INTEGRATED CIRCUIT DEVICE

BACKGROUND OF THE INVENTION

1. Field of the Invention

The present invention relates to a semiconductor integrated circuit device (hereinafter referred to as "semiconductor IC device") internally provided with a logic circuit and a memory circuit. More specifically, the present invention relates to a method of producing mask pattern data when designing circuit patterns for a semiconductor IC device, and an apparatus for carrying out the same method.

2. Description of the Prior Art

Demand for high-performance, low-power-consuming, compact semiconductor IC devices capable of advanced data processing operations for digital signal processing has increased in recent years. A recently proposed semiconductor IC device with built-in DRAM, one of the above-mentioned semiconductor IC devices, is provided with a random logic circuit and a dynamic random access memory circuit (referred to as "DRAM circuit") formed on a semiconductor substrate In the DRAM circuit, the substrate potential of an N-type MOS transistor forming part of a memory cell is a negative potential of, for example, about −1 V for stabilization through the enhancement of resistance to external noise. (Hereinafter, N-type MOS transistors charged at a negative substrate potential including the foregoing N-type MOS transistor will be generally designated as memory side N-type MOS transistors.) The substrate potential of N-type MOS transistors included in the random logic circuit is charged at a ground potential not to obstruct the enhancement of operating speed. (Hereinafter, such a transistor will be designated as logic side N-type MOS transistors.)

If a P-type semiconductor substrate (hereinafter referred to simply as "P-type substrate") on which the DRAM circuit and the random logic circuit are formed is charged at a negative potential the same as the substrate potential. of the memory side N-type MOS transistors to stabilize the memory side N-type MOS transistors, the substrate potential of the logic side N-type MOS transistors must be electrically isolated from the P-type substrate.

In such a case, the logic side N-type MOS transistor is formed in a P-type well region (hereinafter referred to as "P-type well"), and the P-type well and the P-type substrate are electrically isolated by an N-type well potential isolation region (hereinafter referred to as N-type isolation region").

When designing such a semiconductor IC device with built-in DRAM by autoplacement and autorouting techniques, the layout of the N-type isolation regions must be determined by manually operating a mask pattern data producing apparatus (also called layout editor), namely, a circuit designing computer, after designing the random logic circuit and the DRAM circuit by autoplacement and autorouting techniques because information about the N-type isolation region does not include logical information describing the operations of the random logic circuit.

SUMMARY OF THE INVENTION

The present invention has been made to overcome the foregoing problems and has an object to provide a mask pattern data producing apparatus capable of automatically producing a mask pattern for the well potential isolation regions to reduce load on designing a circuit layout and of preventing artificial mistakes.

In addition, the present invention has another object to provide a mask pattern data producing apparatus capable of automatically producing data on wiring lines and contact holes necessary for supplying power to the well potential isolation regions to reduce labor and prevent artificial mistakes.

Further, the present invention has another object to provide a semiconductor IC device having a first IC and a second IC, and capable of applying a stable voltage to well potential isolation regions to avoid generating noise between the first and the second IC.

A mask pattern data producing apparatus according to a first aspect of the present invention comprises: a region specifying means for specifying a first IC forming region and a second IC forming region on a surface of a semiconductor substrate of a first type of conduction, the semiconductor substrate of the first type of conduction having the first IC forming region in which MOS transistors of a second type of conduction are formed in first well regions of a first type of conduction to be charged at a first substrate potential and the second IC forming region in which MOS transistors of the second type of conduction are formed in second well regions of the first type of conduction to be charged at a second substrate potential different from the first substrate potential;

a bottom well mask pattern producing means for producing a mask pattern for forming a bottom well of the second type of conduction under the first well regions in the entire first IC forming region of the semiconductor substrate; and a well wall mask pattern producing means for producing a mask pattern for forming a well wall of the second type of conduction surrounding a first IC formed in the first IC forming region and extending from the surface of the semiconductor substrate to the bottom well on the basis of information about the first IC forming region specified by the region specifying means and information about the bottom well corresponding to the mask pattern produced by the bottom well mask pattern producing means.

A mask pattern data producing apparatus according to a second aspect of the present invention comprises: a region specifying means for specifying a first IC forming region in which a first IC is formed and a second IC forming region in which a second IC is formed, a semiconductor substrate of a first type of conduction having the first IC forming region and the second IC forming region, on a surface of the semiconductor substrate of the first type of conduction wherein the first IC comprises a plurality of cells designed in unit of logical level, at least some of the cells are formed of MOS transistors of a second type of conduction formed in first well regions of the first type of conduction to be charged at a first substrate potential, and at least part of the second IC is formed of MOS transistors of the second type of conduction formed in second well regions of the first type of conduction to be charged at a second substrate potential different from the first substrate potential;

a cell layout specifying means for specifying a layout of the plurality of cells in the first IC forming region on the basis of logical information describing the operations of the first IC;

a wiring route specifying means for specifying wiring routes in the first IC forming region on the basis of logical information describing the operations of the first IC and cell information about the plurality of cells;

a bottom well mask pattern producing means for producing a mask pattern for forming a bottom well of the second type of conduction under the first well regions in the entire first IC forming region of the semiconductor substrate; and a well wall mask pattern producing means for producing a mask pattern for forming a well wall of the second type of conduction surrounding the first IC formed in the first IC forming region and extending from the surface of the semiconductor substrate to the bottom well through calculation using information about the first IC forming region specified by the region specifying means and information about the bottom well corresponding to the mask pattern produced by the bottom well mask pattern producing means.

A mask pattern data producing method according to a third aspect of the present invention comprises the steps of: allowing a region specifying means to specify a first IC forming region and a second IC forming region on a surface of a semiconductor substrate of a first type of conduction, the semiconductor substrate of the first type of conduction having the first IC forming region in which MOS transistors of a second type of conduction are formed in first well regions of a first type of conduction to be charged at a first substrate potential and the second IC forming region in which MOS transistors of the second type of conduction are formed in second well regions of the first type of conduction to be charged at a second substrate potential different from the first substrate potential;

producing a mask pattern for forming a bottom well of the second type of conduction under the first well regions in the entire first IC forming region of the semiconductor substrate by a bottom well mask pattern producing means; and producing a mask pattern for forming a well wall of the second type of conduction surrounding a first IC formed in the first IC forming region and extending from the surface of the semiconductor substrate to the bottom well on the basis of information about the first IC forming region specified by the region specifying means and information about the bottom well corresponding to the mask pattern produced by the bottom well mask pattern producing means.

A mask pattern data producing method according to a fourth aspect of the present invention comprises the steps of: specifying a first IC forming region in which a first IC is formed and a second IC forming region in which a second IC is formed, a semiconductor substrate of a first type of conduction having the first IC forming region and the second IC forming region, on a surface of the semiconductor substrate of the first type of conduction wherein the first IC comprises a plurality of cells designed in unit of logical level, at least some of the cells are formed of MOS transistors of a second type of conduction formed in first well regions of the first type of conduction to be charged at a first substrate potential, and at least part of the second IC is formed of MOS transistors of the second type of conduction formed in second well regions of the first type of conduction to be charged at a second substrate potential different from the first substrate potential;

specifying a layout of the plurality of cells in the first IC forming region on the basis of logical information describing the operations of the first IC;

specifying wiring routes in the first IC forming region on the basis of logical information describing the operations of the first IC and cell information about the plurality of cells;

producing a mask pattern for forming a bottom well of the second type of conduction under the first well regions in the entire first IC forming region of the semiconductor substrate; and producing a mask pattern for forming a well wall of the second type of conduction surrounding the first IC formed in the first IC forming region and extending from the surface of the semiconductor substrate to the bottom well through calculation using information about the first IC forming region specified in the step of specifying the first IC forming region and information about the bottom well corresponding to the mask pattern produced in the step of producing the mask pattern.

A semiconductor IC device according to a fifth aspect of the present invention comprises: a semiconductor substrate of a first type of conduction having on a surface thereof a first IC forming region in which a first IC is formed and a second IC forming region in which a second IC is formed;

first well regions of the first type of conduction formed in the first IC forming region of the semiconductor substrate;

MOS transistors of a second type of conduction formed as components of the first IC in the first well regions;

second well regions of the first type of conduction formed in the second IC forming region of the semiconductor substrate;

MOS transistors of the second type of conduction formed as components of the second IC in the second well regions;

a well potential isolation region having a bottom well of the second type of conduction underlying the first well regions in the entire first IC forming region of the semiconductor substrate, and a well wall surrounding the first IC formed in the first IC forming region and extending from the surface of the semiconductor substrate to the bottom well;

a first wiring layer formed on the surface of the semiconductor substrate, and electrically connected to the surfaces of the first well regions to charge the first well regions at a first potential;

a second wiring layer formed on the surface of the semiconductor substrate, and electrically connected to the surfaces of the second well regions to charge the second well regions at a second potential different from the first potential; and a third wiring layer formed on the surface of the semiconductor substrate and electrically connected to the surface of the well potential isolation region to charge thee well potential isolation region at a third potential for reverse-biasing the PN junction of the well potential isolation region and the semiconductor substrate.

A semiconductor IC device according to a sixth aspect of the present invention comprises: a P-type semiconductor substrate having in a surface thereof a logic circuit forming region in which a logic circuit is formed and a memory circuit forming region in which a memory circuit is formed;

P-type first well regions formed in the logic circuit forming region of the semiconductor substrate;

N-type MOS transistors formed in the first well region as components of the logic circuit;

N-type third well regions formed in the logic circuit forming region of the semiconductor substrate;

P-type MOS transistors formed in the third well region as components of the logic circuit;

P-type second well regions formed in the memory circuit forming region of the semiconductor substrate;

N-type MOS transistors formed in the second well regions as components of the memory circuit;

N-type fourth well regions formed in the memory circuit forming region of the semiconductor substrate;

P-type MOS transistors formed in the fourth well regions as components of the memory circuit;

a well potential isolation region having an N-type bottom well underlying the first and the third well regions in the entire logic circuit forming region of the semiconductor substrate, and an N-type well wall surrounding the logic circuit formed in the logic circuit forming region and extending from the surface of the semiconductor substrate to the bottom well;

a first wiring layer formed on the surface of the semiconductor substrate and electrically connected to the surfaces of the first well regions to charge the first well regions at a ground potential;

a second wiring layer formed on the surface of the semiconductor substrate and electrically connected to the surfaces of the second well regions to charge the second well regions at a negative potential;

a third wiring layer formed on the surface of the semiconductor substrate and electrically connected to the surfaces of the third well regions to charge the third well regions at a positive potential;

a fourth wiring layer formed on the surface of the semiconductor substrate and electrically connected to the surfaces of the fourth well regions to charge the fourth well regions at a positive potential; and a fifth wiring layer formed on the surface of the semiconductor substrate and electrically connected to the surface of the well potential isolation region to charge the well regions al isolation region at a positive potential.

A semiconductor IC device according to a seventh aspect of the present invention comprises: a P-type semiconductor substrate having in a surface thereof a first logic circuit forming region in which a first logic circuit designed and placed on the basis of cells designed in unit of logic level is formed, a second logic circuit forming region designed and placed on the basis of a core managed as design resources, and a memory circuit forming region in which a memory circuit is formed;

P-type first well regions formed in the first logic circuit forming region of the semiconductor substrate;

N-type MOS transistors formed in the first well regions as components of the first logic circuit;

N-type third well regions formed in the first logic circuit forming region of the semiconductor substrate;

P-type MOS transistors formed in the third well regions as components of the first logic circuit;

P-type second well regions formed in the memory circuit forming of the semiconductor substrate;

N-type MOS transistors formed in the second well regions components of the memory circuit;

N-type fourth well regions formed in the memory circuit forming region of the semiconductor substrate;

P-type MOS transistors formed in the fourth well regions as components of the memory circuit;

P-type fifth well regions formed in the second logic circuit forming region of the semiconductor substrate;

N-type MOS transistors formed in the fifth well regions as components of a second logic circuit;

N-type sixth well regions formed in the second logic circuit forming region of the semiconductor substrate;

P-type MOS transistors formed in the sixth well regions as components of the second logic circuit;

a first well potential isolation region having an N-type first bottom well underlying the first and the third well regions in the entire first logic circuit forming region of the semiconductor substrate, and an N-type first well wall surrounding the first logic circuit formed in the first logic circuit forming region and extending from the surface of the seminconductor substrate to the first bottom well;

a second well potential isolation region having an N-type second bottom well underlying the fifth and the sixth well regions in the entire second logic circuit forming region of the semiconductor substrate, and an N-type second well wall surrounding the second logic circuit formed in the second logic circuit forming region and extending from the surface of the semiconductor substrate to the second a bottom well;

a first wiring layer formed on the surface of the semiconductor substrate and electrically connected to the surfaces of the first well region to charge the first well regions at a ground potential;

a second wiring layer formed on the surface of the semiconductor substrate and electrically connected to the surfaces of the second well regions to charge the second well regions at a negative potential;

a third wiring layer formed on the surface of the semiconductor substrate and electrically connected to the surfaces of the third well regions to charge the third well regions at a positive potential;

a fourth wiring layer formed on the surface of the semiconductor substrate and electrically connected to the surfaces of the fourth well regions to charge the fourth well regions at a positive potential;

a fifth wiring layer formed on the surface of the semiconductor substrate and electrically connected to the surfaces of the fifth well regions to charge the fifth well regions at a ground potential;

a sixth wiring layer formed on the surface of the semiconductor substrate and electrically connected to the surfaces of the sixth well regions to charge the second well regions at a positive potential;

a seventh wiring layer formed on the surface of the semiconductor substrate and electrically connected to the surface of the first well potential isolation region to charge the first well potential isolation region at a positive potential; and an eighth wiring layer formed on the surface of the semiconductor substrate and electrically connected to the surface of the second well potential isolation region to charge the second well potential isolation region at a positive potential.

DETAILED DESCRIPTION OF THE PREFERRED EMBODIMENTS

First Embodiment

A semiconductor IC device with built-in DRAM in a first embodiment according to the present invention will be described hereinafter with reference to FIGS. 3 to 8.

Figure 3:
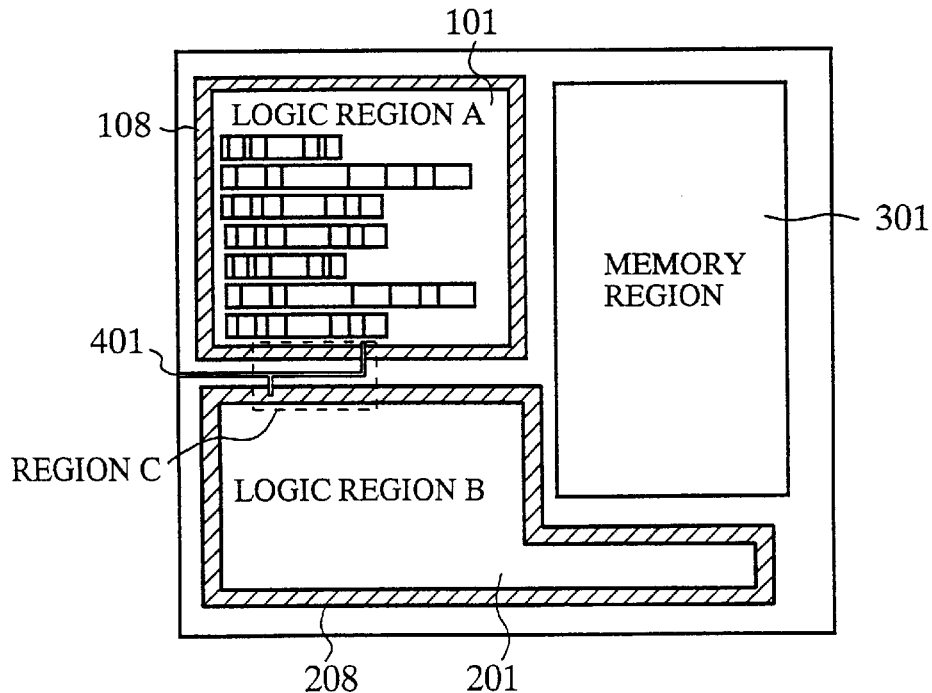
FIG. 3 is a schematic plan view of a semiconductor IC device with built-in DRAM in a first embodiment according to the present invention.
Figure 4:
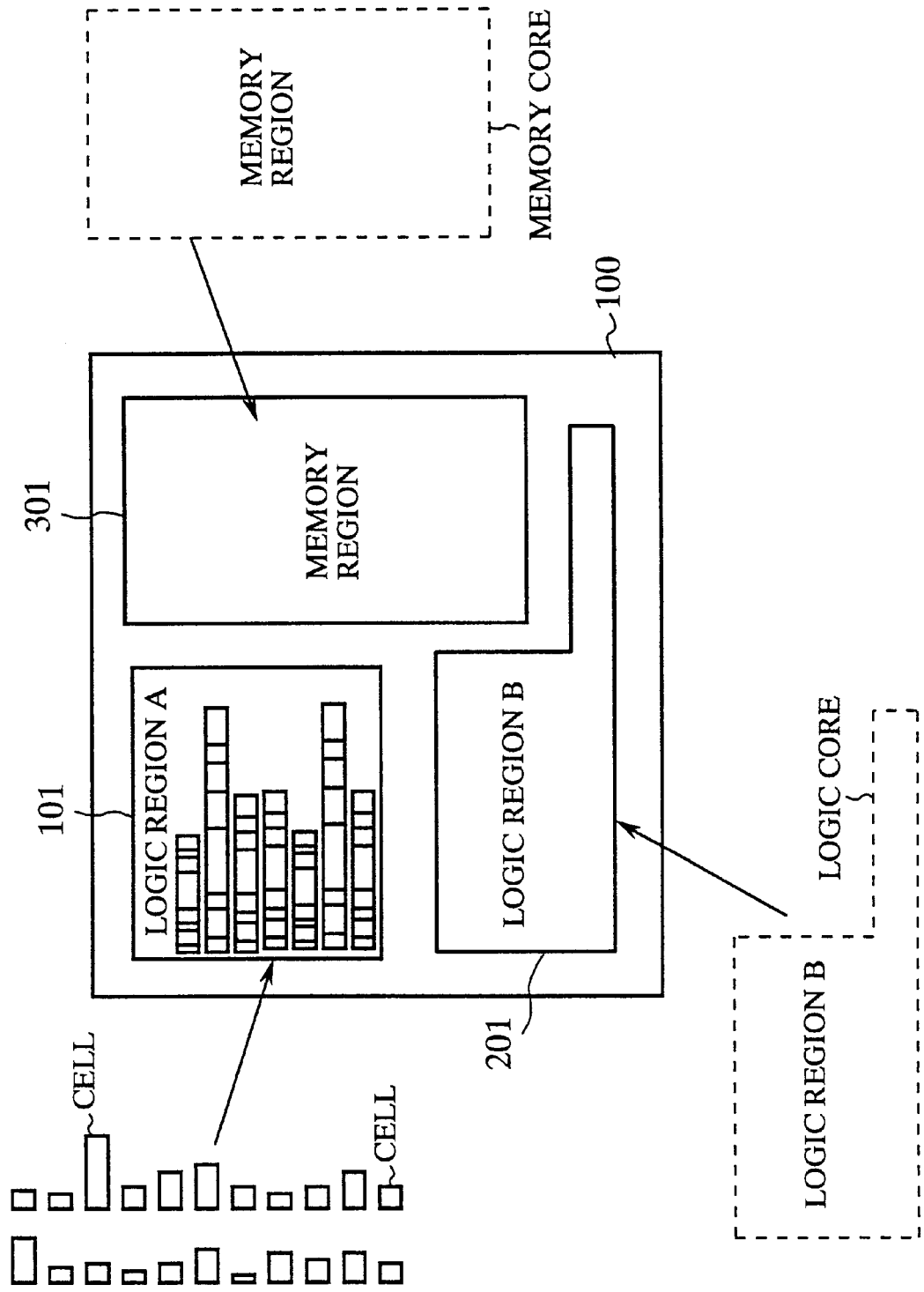
FIG. 4 is a schematic plan view of regions for the circuits of the semiconductor IC device with built-in DRAM in the first embodiment.

Referring to FIGS. 3 and 4, the semiconductor IC device comprises, in combination, a plurality of cells including AND gates, OR gates, exclusive gates and flip-flop circuits. A first logic circuit formed in a first logic circuit forming region A comprises the foregoing cells and the layout of those cells is determined by an autoplacement and autorouting apparatus.

The first logic circuit comprises, in combination, a plurality of cells formed of P-type MOS transistors (hereinafter referred to as "P-type transistors") and N-type MOS transistors (hereinafter referred to as "N-type transistors") formed in N-type well regions (hereinafter referred to as "N-type wells") and P-type well regions (hereinafter referred to as "P-type wells") formed continuously in order of N-type well, P-type well, P-type well, N-type well, N-type well, P-type well, . . . in the first logic circuit forming region A 101 of a P-type semiconductor substrate 100 (hereinafter referred to as P-type substrate) in a vertical direction, as viewed in FIG. 4.

Figure 5:
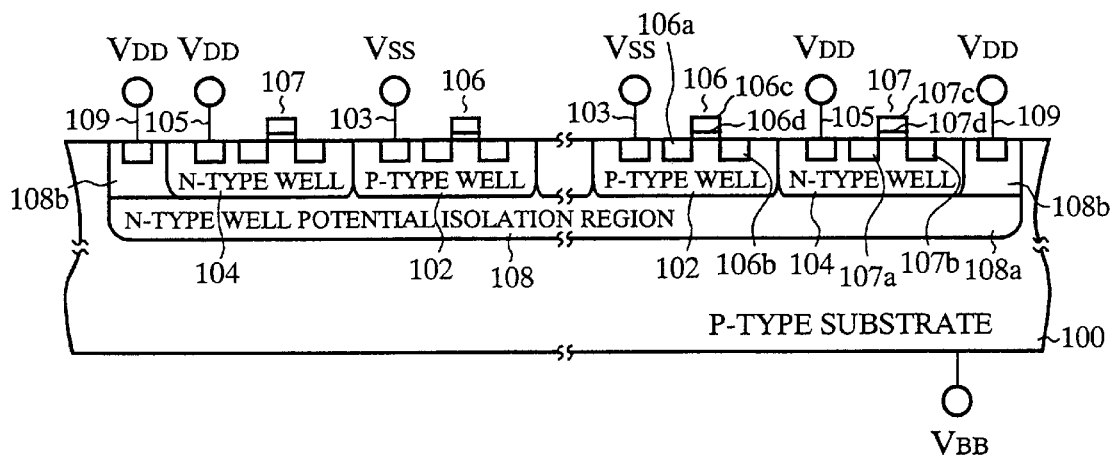
FIG. 5 is a typical sectional view of an essential part of a first logic circuit forming region 101 in the semiconductor IC device with built-in DRAM in the first embodiment.

The N-type transistors and the P-type transistors of the first logic circuit are formed in a configuration shown in FIG. 5.

Referring to FIG. 5, each of the P-type wells 102 formed in the first logic circuit forming region A 101 is connected by a grounding line (first wiring layer) 103 which is provided on the P-type substrate 100 to a ground of a ground potential VSS of, for example, 0 V. The N-type wells 104 are formed in the first logic circuit forming region A 101. The P-type wells 102 and the N-type wells 104 are arranged regularly in order of N-P-P-N-N-P . . . A power line 105 formed on the surface of the P-type substrate 100 is connected electrically to each of the N-type wells 104 to apply a supply potential VDD of, for example, 5 V to the N-type wells 104. A negative potential of, for example, about −1 V is applied to the P-type substrate 100.

N-type transistors 106 are formed in the P-type wells 102. Each of the N-type transistors 106 comprises a pair of N-type source/drain regions 106a and 106b formed in channel regions formed in the surface of the P-type well 102, and a gate electrode 106c formed on a gate oxide film 106d formed on the channel region.

P-type transistors 107 are formed in the N-type wells 104. Each of the P-type transistors 107 comprises a pair of P-type source/drain regions 107a and 107b formed in channel regions formed in the surface of the N-type well 104, and a gate electrode 107c formed on a gate oxide film 107d formed on the channel region.

Although the pair of source/drain regions 107a and 107b are arranged in the direction of arrangement of the P-type wells 102 and the N-type wells 104, i.e., a lateral direction as viewed in FIG. 5, to facilitate understanding the N-type transistors 106 and P-type transistors 107, actually, the pair of source/drain regions 107a and 107b are arranged in a direction perpendicular to the direction of arrangement of the P-type wells 102 and the N-type wells 104, i.e., a direction perpendicular to the paper. Actually, the respective gate electrodes 106c and 107c of the N-type transistors 106 and the P-type transistors 107 are formed so as to extend laterally as viewed in FIG. 5, and the respective gate electrodes 106c and 107c of the adjacent transistors 106 and 107 are aligned.

An N-type well potential isolation region (hereinafter referred to as "N-type isolation region") 108 has an N-type bottom well 108a underlying the P-type wells 102 and the N-type wells 104 in the entire first logic circuit forming region A 101 of the P-type substrate 100, and an N-type well wall 108b surrounding the first logic circuit formed in the first logic circuit forming region A 101 and extending from the surface of the P-type substrate 100 to the bottom well 108a. Power lines (third wiring layer) 109 formed on the surface of the P-type substrate 100 are connected to a plurality of parts of the surface of the well wall 108b of the N-type isolation region 108 to apply the supply potential VDD of, for example, 5 V to the well wall 108b.

Since the supply potential VDD is applied to the plurality of parts of the surface of the well wall 108b of the N-type isolation region 108 and to the N-type wells 104, there are scarce potential differences between parts in the entire N-type isolation region 108, and the potential of the N-type isolation region 108 is substantially equal to the supply potential VDD.

Since the supply potential VDD is applied to the N-type isolation region 108 and a negative potential is applied to the P-type substrate 100, a PN junction between the N-type isolation region 108 and the P-type substrate 100 is reverse-biased. Thus, the N-type isolation region 108 functions as an electrical isolation region relative to the P-type substrate 100 to isolate the P-type substrate 100 electrically from the P-type wells 102.

Referring again to FIGS. 3 and 4, a second logic circuit comprising components designed and arranged on the basis of a logic core managed as design resources is formed in a second logic circuit forming region B 201.

The second logic circuit comprises N-type transistors and P-type transistors formed in P-type wells and N-type wells formed arranged on the basis of the logic core in the second logic circuit forming region B 201 of the P-type substrate 100.

Figure 6:
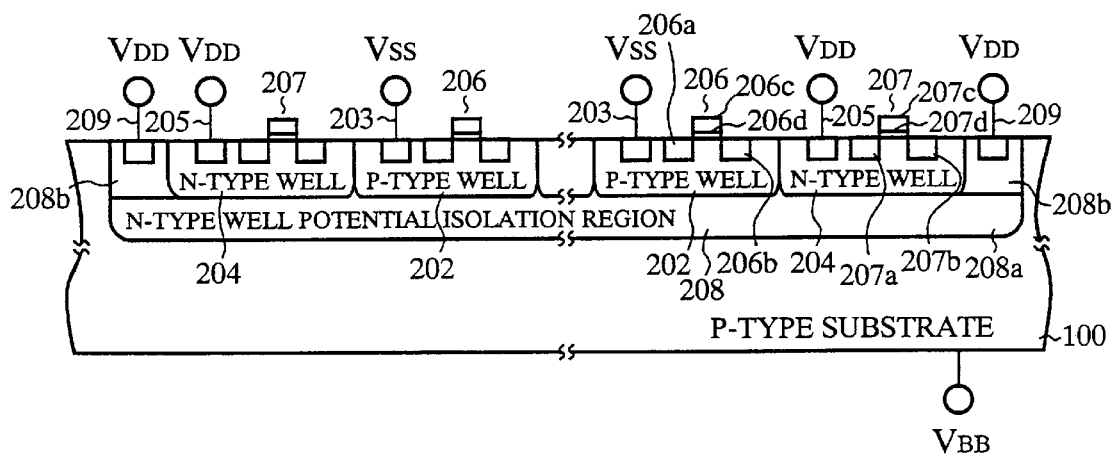
FIG. 6 is a typical sectional view of an essential part of a second logic circuit forming region 201 in the semiconductor IC device with built-in DRAM in the first embodiment.

The N-type transistors and the P-type transistors of the second logic circuit are formed in a configuration shown in FIG. 6.

As shown in FIG. 6, the P-type wells 202 are formed in the second logic circuit forming region B 201. Each of the P-type wells 202 is connected electrically by the grounding line (first wiring layer) 103 formed on the surface of the P-type substrate 100 to the ground of a ground potential VSS of, for example, 0 V. The N-type wells 204 are formed in the second logic circuit forming region B 201. The power line 105 formed on the surface of the P-type substrate 100 is connected electrically to each of the N-type wells 204 to apply the supply potential VDD of, for example, 5 V to the N-type wells 204.

The N-type transistors 206 are formed in the P-type wells 202. Each of the N-type transistors 206 comprises a pair of N-type source/drain regions 206a and 206b formed in channel regions formed in the surface of the P-type well 202, and a gate electrode 206c formed on a gate oxide film 206d formed on the channel region.

P-type transistors 207 are formed in the N-type wells 204. Each of the P-type transistors 207 comprises a pair of P-type source/drain regions 207a and 207b formed in channel regions formed in the surface of the N-type well 204, and a gate electrode 207c formed on a gate oxide film 207d formed on the channel region.

An N-type well potential isolation region (hereinafter referred to as "N-type isolation region") 208 has an N-type bottom well 208a underlying the P-type wells 202 and the N-type wells 204 in the entire second logic circuit forming region B 201, and an N-type well wall 208b surrounding the second logic circuit formed in the second logic circuit forming region B 201 and extending from the surface of the P-type substrate 100 to the bottom well 208a. Power lines (third wiring layer) 205 formed on the surface of the P-type substrate 100 are connected to a plurality of parts of the surface of the well wall 208b of the N-type isolation region 208 to apply the supply potential VDD of, for example, 5 V to the well wall 208b.

Since the supply potential VDD is applied to the plurality of parts of the surface of the well wall 208b of the N-type isolation region 208 and to the N-type wells 204, there are scarce potential differences between parts in the entire N-type isolation region 208, and the potential of the N-type isolation region 208 is substantially equal to the supply potential VDD.

Since the supply potential VDD is applied to the N-type isolation region 208 and the negative potential is applied to the P-type substrate 100, a PN junction between the N-type isolation region 208 and the P-type substrate 100 is reverse-biased. Thus, the N-type isolation region 208 functions as an electrical isolation region relative to the P-type substrate 100 to isolate the P-type substrate 100 electrically from the P-type wells 202.

Referring again to FIGS. 3 and 4, a memory circuit comprising components designed and arranged on the basis of a logic core managed as design resources is formed in a memory circuit forming region 301.

The memory circuit in the first embodiment is a DRAM. As is generally known, the DRAM comprises a memory cell array formed by arranging memory cells each consisting of an N-type MOS transistor and a capacitor in lines and columns, pairs of bit lines arranged in a plurality of lines, sense amplifiers each combined with the pair of bit lines, word lines arranged in lines, a line decoder for selecting a predetermined word line out of the plurality of word lines, a row decoder for selecting a predetermined pair of bit lines out of the plurality of pairs of bit lines, a substrate potential generating circuit for generating a negative substrate potential of, for example, abut −1 V in the first embodiment to the P-type substrate 100 and desired P-type wells, and peripheral circuits.

For example, a negative potential (for example, about −1 V) is applied to the substrate potential applied to the N-type MOS transistor of each memory cell (hereinafter N-type MOS transistors including those of the memory cells to which a negative potential is applied will be generally called "N-type transistor (N)") for the enhancement of resistance against external noise and stabilization. in the line decoder, the row decoder and the substrate potential generating circuit, the substrate potential of the N-type MOS transistors is equal to a ground potential (hereinafter referred to as "N-type transistor (G)") to avoid reducing the operating speed.

Figure 7:
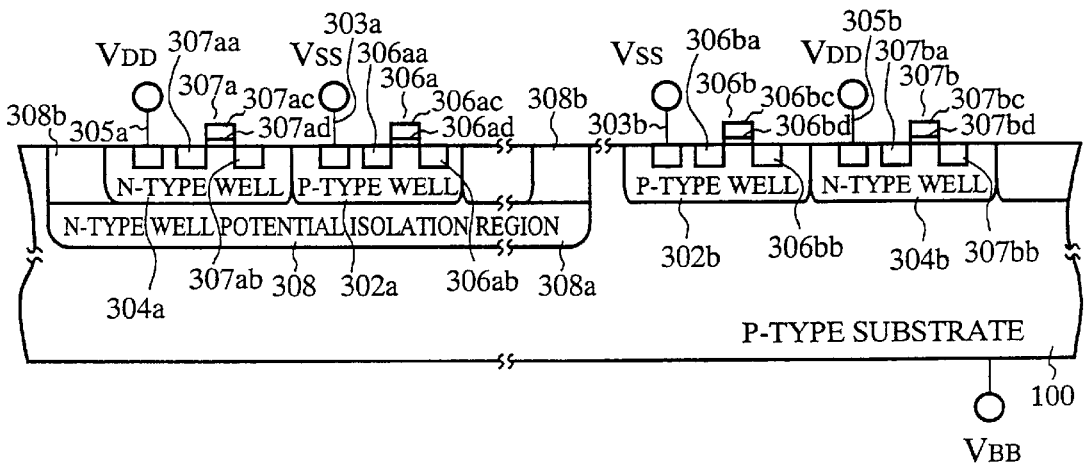
FIG. 7 is a typical sectional view of an essential part of a memory circuit forming region 301 in the semiconductor IC device with built-in DRAM in the first embodiment.

The N-type transistors (G) of the memory circuit, the N-type transistors (N) and the P-type transistors are formed as shown in FIG. 7.

Referring to FIG. 7, P-type wells 302a and 302b are formed in the memory circuit forming region 301. A grounding line (first wiring layer) 303a formed on the surface of the P-type substrate 100 is connected electrically to the surface of the P-type well 302a to apply the ground potential VSS of, for example, 0 V to the P-type well 302a. A negative potential VBB of, for example, about −1 V is applied to the P-type well 302b through a second grounding line (second wiring layer) 303b electrically connected to the surface of the P-type well 302b and formed on the surface of the P-type substrate 100 by the substrate potential generating circuit.

N-type wells 304a and 304b are formed in the memory circuit forming region 301. The supply potential VDD of, for example, 5 V in the first embodiment, is applied through a power line 105 electrically connected to the surfaces of the N-type wells 304a and 304b and formed on surface of the P-type substrate 100.

An N-type transistor (G) 306a formed in the P-type well 302a comprises a pair of N-type source/drain regions 306aa and 306ab formed on a channel region formed on the surface of the P-type well 302a, and a gate electrode 306ac formed on a gate oxide film 306ad formed on the channel region. An N-type transistor (N) 306b formed in the P-type well 302b comprises a pair of N-type source/drain regions 306ba and 306bb formed on a channel region formed on the surface of the P-type well 302b, and a gate electrode 306bc formed on a gate oxide film 306bd formed on the channel region.

A P-type transistor 307a formed in the N-type well 304a comprises a pair of P-type source/drain regions 307aa and 307ab formed on a channel region on the surface of the N-type well 304a, and a gate electrode 307ac formed on a gate oxide film 307ad formed on a channel region. A P-type transistor 307b formed in the N-type well 304b comprises a pair of P-type source/drain regions 307ba and 307bb formed on a channel region on the surface of the N-type well 304b, and a gate electrode 307bc formed on a gate oxide film 307bd formed on a channel region.

An N-type well potential isolation region (hereinafter referred to as "N-type isolation region") 308 has a bottom well 308a underlying the P-type well 302a and the N-type well 304a in the entire circuit region including the N-type transistors (G) formed in the memory circuit forming region 301 of the P-type substrate 100, and an N-type well wall 308b surrounding the circuit and extending from the surface of the P-type substrate 100 to the surface of the bottom well 308a. The supply potential is applied through the N-type well 304a to the N-type isolation region 308.

Figure 8:
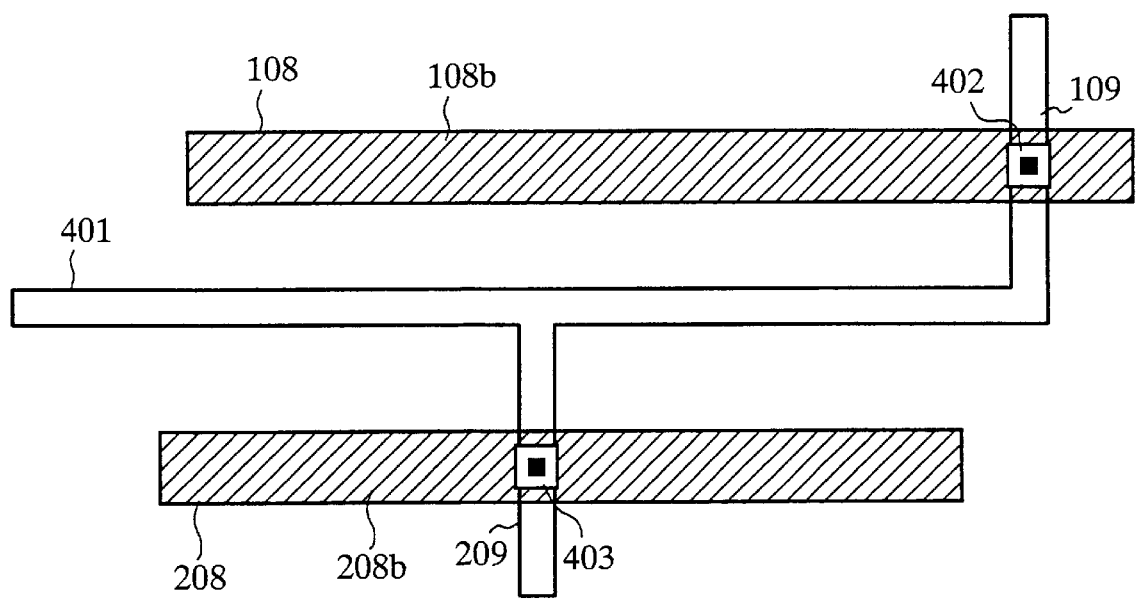
FIG. 8 is an enlarged view of a region C shown in FIG. 3.

Referring again to FIG. 3, a power wiring layer 401 (only a part thereof is shown) of, for example, aluminum is formed on an insulating layer formed on the P-type substrate 100 and is connected to a power supply pad. The supply potential VDD of 5 V in the first embodiment is applied to the power wiring layer 401 through the power supply pad by an external power supply outside the semiconductor IC device. The supply potential VDD is applied through the power supply wiring layer 401 to the first and the second circuit and the memory circuit. As shown in FIG. 8, the power supply wiring layer 401 has parts intersecting the surface of the well wall 108b of the N-type isolation region 108 formed in the first logic circuit forming region 101, and these parts of the power supply wiring layer 401 are the power supply lines 109 shown in FIG. 5.

Contact cells 402 are formed at the intersections of the power supply lines 109 and the surface of the well wall 108b to connect the power supply lines 109 and the well wall 108b electrically. The contact cells 402 are formed in contact holes formed in an insulating layer formed between the surface of the P-type substrate 100 and the power supply lines 109 of the power supply wiring layer 401.

As shown in FIG. 8, the power supply wiring layer 401 has parts intersecting the surface of the well wall 208b of the N-type isolation region 208 formed in the second logic circuit forming region 201, and these parts of the power supply wiring layer 401 correspond to the power supply lines 209. Contact cells 403 are formed at the intersections of the power supply lines 209 and the surface of the well wall 208b to connect the power supply lines 209 and the well wall 208b electrically. The contact cells 403 are formed in contact holes formed in the insulating-layer formed between the surface of the P-type substrate 100 and the power supply lines 209 of the power supply wiring layer 401.

The supply potential is applied to the N-type isolation region 308 and the negative potential is applied to the P-type substrate 100. Therefore the PN junction of the N-type isolation region 308 and the P-type substrate 100 is reverse-biased. Thus, the N-type isolation 308 functions as an electrical isolation region relative to the P-type substrate 100 to isolate the P-type substrate 100 electrically from the P-type wells 302a.

A mask pattern data producing apparatus for automatically producing a mask pattern for the bottom well 108a and the well wall 108b of the N-type isolation regions 108 and 208 in the first logic circuit forming region 101 and the second logic circuit forming region 201 of the semiconductor IC device with built-in DRAM shown in FIGS. 3 to 7, and a method of automatically producing the same mask pattern will be described with reference to FIGS. 1 and 2.

Figure 1:
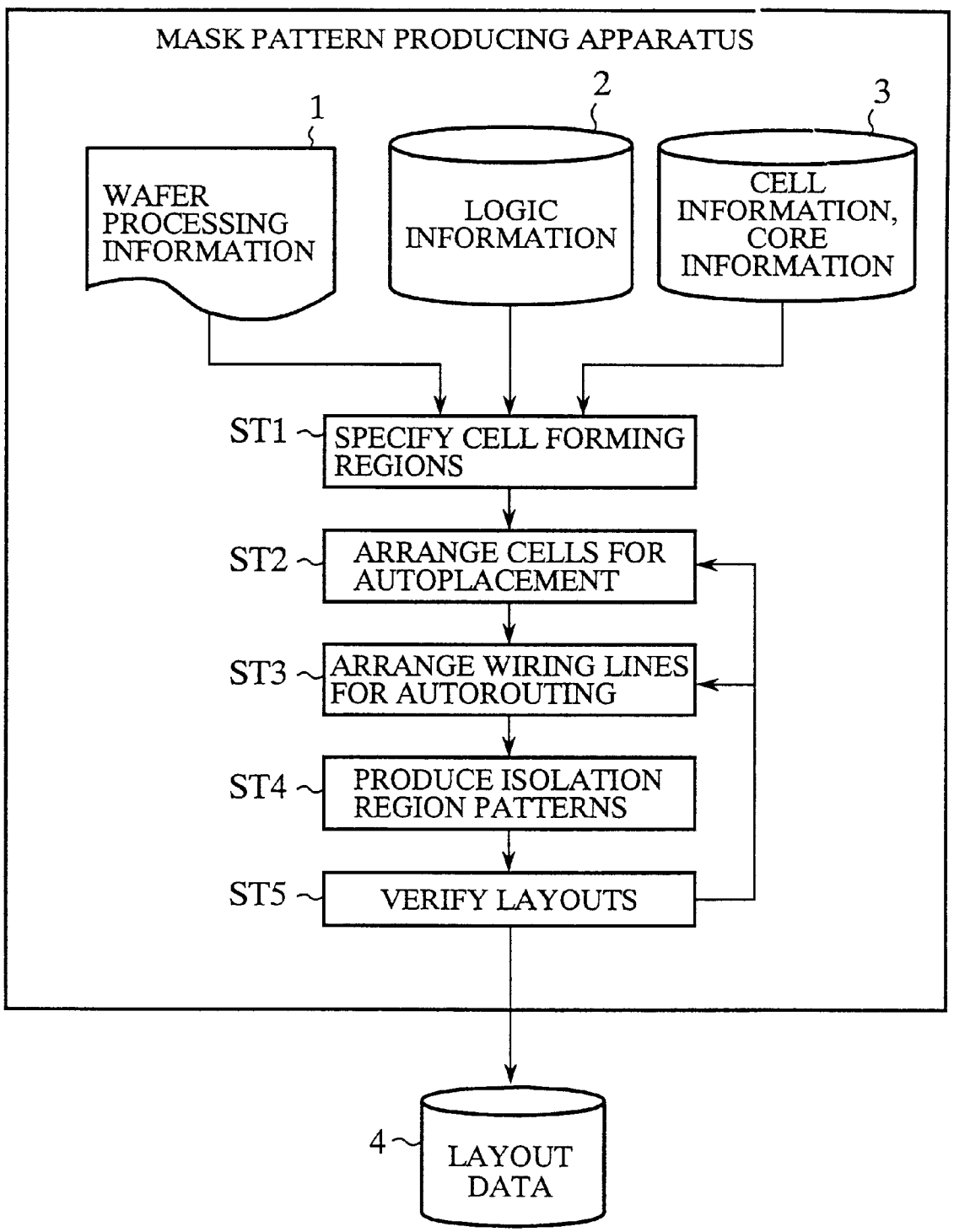
FIG. 1 is a flow chart of a procedure to be carried out by a mask pattern data producing apparatus in a first embodiment according to the present invention.

FIG. 1 is a flow chart of a procedure to be carried out by a mask pattern data producing apparatus in the first embodiment according to the present invention.

Shown in FIG. 1 are wafer processing information 1, namely, information about semiconductor IC device fabricating process, logic information 2 describing the operations of first and second ICs and the memory circuit and stored in a logic information storage means, cell information 3 about cells including AND gates, OR gates, exclusive OR gates and flip-flops, and core information 3 about a logic core managed as design resources and about memory core managed as design resources. The cell information 3 and the core information 3 are stored in a cell and core information storage means.

In step ST1, namely, region specifying step, the first logic circuit forming region 101 for the first IC, the second logic circuit forming region 201 for the second IC, and the memory forming region 301 for the memory circuit (these regions will be generally designated as "cell forming regions") are specified on the surface of the P-type semiconductor substrate 100 by a region specifying means of an autoplacement and autorouting apparatus on the basis of the wafer processing information 1, the logic information 2 retrieved from the logic information storage means, and cell information 3 and the core information 3 retrieved from the cell and core information storage means.

In step ST1, positions of the first logic circuit forming region 101, the second logic circuit forming region 201 and the memory circuit forming region 301 on the surface of the P-type substrate 100 are determined, and the layout of the components, such as the transistors, of the second logic circuit and the memory circuit in the second logic circuit forming region 201 and the memory circuit forming region 301 is determined.

In step ST2, namely, a cell layout specifying step, the component cells of the first logic circuit are arranged automatically on the surface of the first logic circuit forming region 101 and the layout is determined by a cell layout specifying means of the autoplacement and autorouting apparatus on the basis of the cell information 3 retrieved from the cell and core information storage means. In cell layout specifying step ST2, the layout of the cells of the first logic circuit and the components including the transistors of the cells in the first logic circuit forming region 101 is determined.

Step ST3 is wiring line layout specifying step for specifying positions of wiring lines in the first and the second logic circuit and the memory circuit, and those of wiring lines between those circuits. A wiring line layout specifying means of the autoplacement and autorouting apparatus specifies the positions of wiring lines between the component elements of the first logic circuit, such as the transistors, on the basis of the logic information 2 describing the operations of the first logic circuit and retrieved from the logic information storage means and cell information 3 retrieved from the cell and core information storage means. The wiring line layout specifying means of the autoplacement and autorouting apparatus specifies positions of wiring lines interconnecting the component elements, such as transistors, of the second logic circuit and the memory circuit, and positions of wiring lines between the circuits on the basis of the logic information 2 describing the operations of the second logic circuit and the memory circuit and retrieved from the logic information storage means, and the core information 3 retrieved from the cell and core information storage means. Wiring line layout specifying step ST3 specifies also the layout of the first grounding lines 103, 203 and 303a, the second grounding line 303b and the power lines 105, 109, 205, 209 and 305a.

Step ST4 is isolation region pattern producing step, in which mask patterns for forming the bottom well 108a and the well wall 108b of the N-type isolation region 108 in the first logic circuit forming region 101, and the bottom well 208a and well wall 208b of the N-type isolation region 208 in the second logic circuit forming region 201 are produced. In the isolation region pattern producing step ST4, a bottom well mask pattern producing means of the autoplacement and autorouting apparatus produces, on the basis of the information about the first logic circuit forming region 101 and the second logic circuit forming region 201 specified in region specifying step ST1, a mask pattern for forming the bottom well 108a of the N-type isolation region 108 underlying the N-type well 102 and the P-type well 104 in the entire first logic circuit forming region 101 in which the first logic circuit is formed, and the bottom well 208a of the N-type isolation region 208 underlying the P-type well 202 and the N-type well 204 in the entire second logic circuit forming region 201 in which the second logic circuit is formed.

A well wall mask pattern producing means of the autoplacement and autorouting apparatus executes calculations using the information about the first logic circuit forming region 101 and the second logic circuit forming region 201 specified in region specifying step ST1 and the information about the bottom wells 108a and 108b included in the mask pattern produced by the bottom well mask pattern producing means to produce a mask pattern for forming the N-type well wall 108b of the N-type isolation region 108, surrounding the first logic circuit formed in the first logic circuit forming region 101 and extending from the surface of the P-type substrate 100 to the bottom well 108a, and the N-type well wall 208b of the N-type isolation region 208, surrounding the second logic circuit formed in the second logic circuit forming region 201 and extending from the surface of the P-type substrate 100 to the bottom well 208a.

Step ST5 is layout verifying step, in which whether the contents of the mask patterns produced in the preceding steps meet the wafer processing information 1 and the logic information 2 is verified. Final mask pattern layout data 4 is stored in a layout data storage means.

Figure 2:
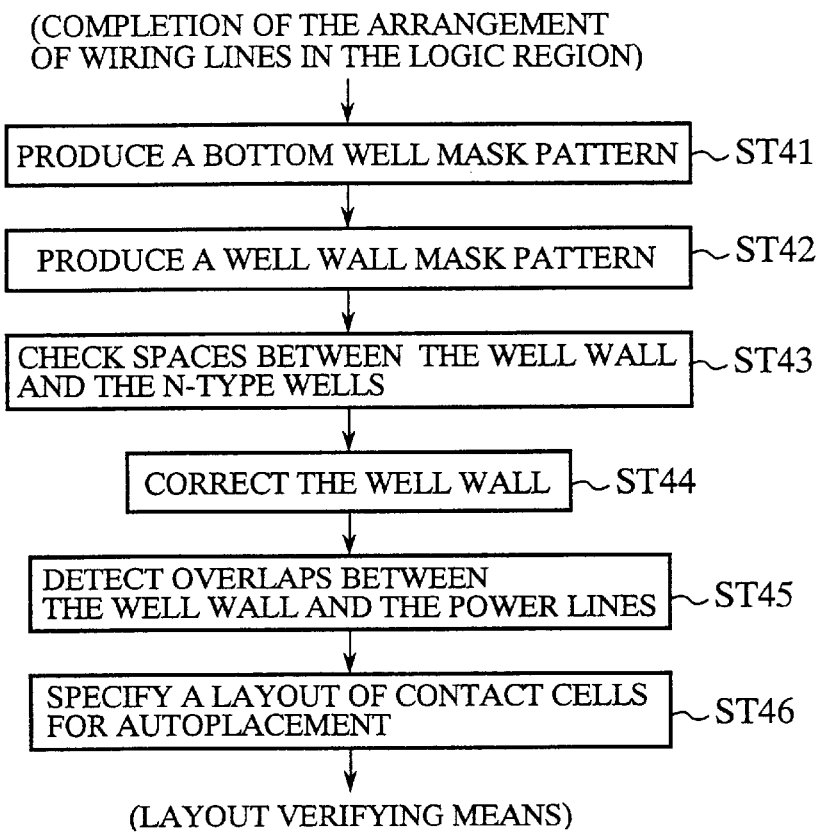
FIG. 2 is a flow chart of the essential operations of the mask pattern data producing apparatus in the first embodiment.

FIG. 2 is a flow chart of a procedure for producing the mask pattern for forming the bottom wells 108a and 208a and the well walls 108b and 208b to be executed in the isolation region pattern producing step ST4 shown in FIG. 1. Referring to FIG. 2, Step ST41 is a bottom well mask pattern producing step, in which mask pattern data on the mask for forming the bottom wells 108a and 208a of the N-type isolation regions 108 and 208 is produced automatically. The bottom well mask pattern producing means produces the mask pattern of the mask for forming the bottom wells 108a and 208a somewhat greater in shape than the first logic circuit forming region 101 and the second logic circuit forming region 201 on the basis of information about the first logic circuit forming region 101 and the second logic circuit forming region 201 specified in the region specifying step ST1.

Step ST42 is a well wall mask pattern producing step for automatically producing a mask pattern for forming the well walls 108b and 208b of the N-type isolation regions 108 and 208, in which the well wall mask pattern producing means executes calculations using information about the first logic circuit forming region 101 and the second logic circuit forming region 201 specified in the region specifying step ST1, and the information about the bottom wells 108a and 108b included in the mask pattern produced by the bottom well mask pattern producing means to produce a mask pattern for forming the well walls 108b and 208b corresponding to portions of the bottom wells 108a and 208a fringing the entire peripheries of the first logic circuit forming region 101 and the second logic circuit forming region 201.

Step ST43 is a space checking step, in which spaces between the well wall 108b produced in the well wall pattern producing step ST42 and all the N-type wells 104 formed in the first logic circuit forming region 101 are checked and correction information, i.e., graphic data, is provided if any one of the spaces is greater than zero and less than a predetermined value (a value corresponding to a minimum width of the component elements of the first logic circuit), and spaces between the well wall 208b produced in the well wall mask pattern producing step ST42 and all the N-type wells 204 formed in the second logic circuit forming region 201 are checked and correction information, i.e., graphic data, is provided if any one of the spaces is greater than zero and less than a predetermined value (a value corresponding to a minimum width of the component elements of the second logic circuit). A space checking means of the autoplacement and autorouting apparatus executes an arithmetic process for step ST43.

Step ST44 is a well wall pattern correcting step, in which the widths of the well walls 108b and 208b determined in well wall mask pattern producing step ST42 are increased according to the correction information obtained in space checking step ST43, and a mask pattern for forming the corrected well walls 108b and 208b is produced automatically. A well wall pattern correcting means of the autoplacement and autorouting apparatus carries out operations for producing the mask pattern for forming the corrected well walls 108b and 208b.

In the first embodiment, the mask pattern for forming the corrected well walls 108b and 208b is combined with a well mask pattern based on the cell information 3 about the first and the second logic circuit and the memory circuit, and information about the N-type wells 104, 204, 304a and 304b, and the well wall 308b included in the core information 3 to form the well walls 108a and 208b simultaneously with the N-type wells 104, 204, 304a and 304b and the well wall 308b formed in the first logic circuit forming region 101, the second logic circuit forming region 201 and the memory circuit forming region 301.

Step ST45 is an overlap detecting step, in which overlaps between the corrected well walls 108b and 208b represented by the mask pattern for forming the corrected well walls 108b and 208b produced in step 41, namely, the well wall correcting step and the power lines of the layout specified in wiring line layout specifying step ST3 are detected. An overlap detecting means of the autoplacement and autorouting apparatus executes arithmetic operations for overlap detection.

In contact cell autoplacement step ST46, a layout of contact cells for electrically connecting the surface of the P-type substrate 100 and the power line layer is specified automatically by a contact cell layout determining means of the autoplacement and autorouting apparatus.

A mask pattern producing method will be described hereinafter.

The wafer processing information 1, the logic information 2 describing the operations of the first and the second IC circuit and the memory circuit, the cell information 3 about the first logic circuit, and the core information 3 about the second logic circuit and the memory circuit are prepared beforehand. The conventional defined information may be used for the thus prepared information as it is. Then region specifying step ST1 shown in FIG. 1 is executed to specify the positions of the first logic circuit forming region 101, the second logic circuit forming region 201 and the memory circuit forming region 301 for autoplacement by using the foregoing information. Then, cell layout specifying step ST2 shown in FIG. 1 is executed to specify the layout of the component cells of the first logic circuit in the first logic circuit forming region 101 for autoplacement. Wiring line layout specifying step ST3 shown in FIG. 1 is executed to specify the layout of all the wiring lines for autoplacement.

Figure 9:
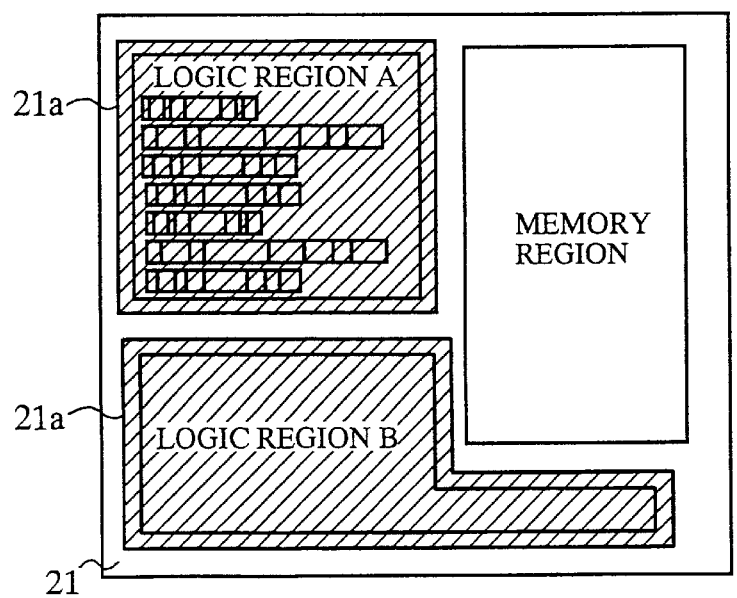
FIG. 9 is a view of assistance in explaining a mask pattern for forming a bottom well in the first embodiment.

Then a graphic data processing operation is carried out to increase the sizes of the first logic circuit forming region 101 and the second logic circuit forming region 201 represented by the information specified in region specifying step ST1 by values meeting design standards for wafer processing. A mask pattern 21 for forming the bottom wells 108a and 208a is obtained on the basis of information about the regions of the increased sizes (bottom well mask pattern producing step ST41 shown in FIG. 2). For example, the mask pattern 21 is formed so that shaded regions 21a on the surface of the P-type substrate 100 shown in FIG. 9 are irradiated with light.

Figure 10:
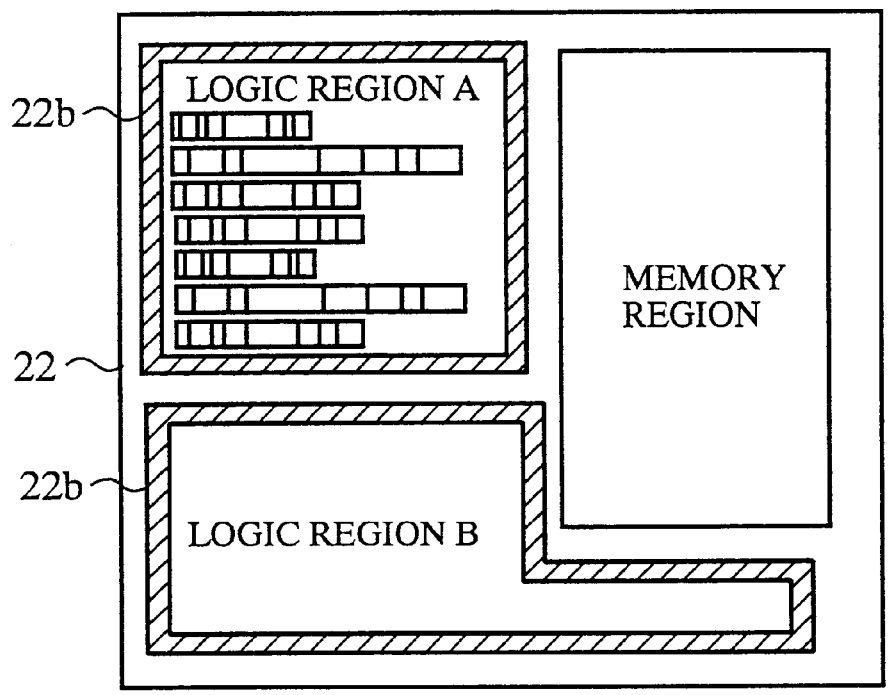
FIG. 10 is a view of assistance in explaining a mask pattern for forming a well wall in the first embodiment.

A Boolean operation of figure is executed to subtract information about the first logic circuit forming region 101 and the second logic circuit forming region 201 specified in region specifying step ST1 from information about the bottom wells 108a and 208a in the mask pattern 21 for forming the bottom wells 108a and 208a produced in bottom well mask pattern producing step ST41 to obtain a mask pattern 22 for forming the well walls 108b and 208b (well wall mask pattern producing step ST42). For example, the mask pattern 22 is formed so that shaded regions 22a on the surface of the P-type substrate 100 shown in FIG. 10 are irradiated with light.

Figure 11:
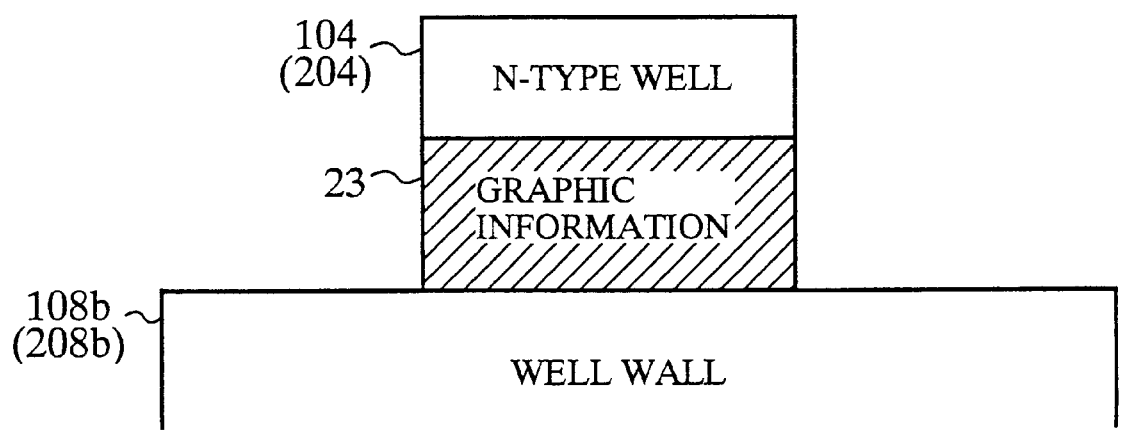
FIG. 11 is a view of assistance in explaining a mask pattern for forming a corrected well wall in the first embodiment.

Spaces between the well wall 108b and the N-type wells 104 and spaces between the well wall 208b and the N-type wells 204 are calculated by using the information about the well walls 108b and 208b of the mask pattern 22 for forming the well walls 108b and 208b produced in well wall mask pattern producing step ST42, and the information about all the N-type wells 104 and 204 for forming the first and the second logic circuit originally included in the cell information 3 and the core information 3, and the results of calculation are compared with predetermined values to obtain correcting information in graphic information (space checking step ST43 shown in FIG. 2). As shown by way of example in FIG. 11, if the space between the well wall 108b (208b) and the N-type well 104 (204) is less than the predetermined value, the correcting information, namely, the graphic information, represents a plane pattern between the respective opposite sides of the well wall 108b (208b) and the N-type well 104 (204). The graphic information is added for correction to the information about the well walls 108b and 208b produced in well wall mask pattern producing step ST42 to obtain a mask pattern for forming the corrected well walls 108b and 208b (well wall pattern correcting step ST44 shown in FIG. 2).

A Boolean operation of figure is executed to add the information about the corrected well walls 108b and 208b of the mask pattern for forming the well walls 108b and 208b, and the information about the N-type wells 104 and 204, 304a and 304b and the well wall 308b originally included in the cell information 3 and the core information 3 about the first and the second logic circuit and the memory circuit to obtain a well mask pattern for simultaneously forming the well walls and the N-type wells.

Subsequently, a logical AND operation between information about the corrected well walls 108b and 208b of the mask pattern for forming the corrected well walls 108b and 208b produced in well wall pattern correcting step ST44 and information about the power line layout specified in wiring line layout specifying step ST3 to detect overlaps between the well walls 108b and 208b, and the power lines (overlap detecting step ST45 in FIG. 2). The contact cells 402 and 403 are arranged automatically at positions corresponding to overlaps detected in overlap detecting step ST45 according to information about contact cells for electrically connecting the surface of the P-type substrate 100 and the power line layer.

Then, the layout is verified in the layout verifying step ST5 shown in FIG. 1 and, if there is no any problem in the layout, the layout data obtained in the foregoing steps (naturally, including the data on the mask pattern for forming the N-type isolation regions 108 and 208) is stored in a layout storage means to use the layout data for fabricating the semiconductor IC device with built-in DRAM.

Thus the first embodiment is capable of designing the mask pattern for forming the N-type isolation regions 108 and 208 by the autoplacement and autorouting apparatus on the basis of the wafer processing information 1 determined previously, the logic information 2 describing the first and the second IC circuit and the memory circuit, the cell information 3 about the first logic circuit and the core information 3 about the second logic circuit and the memory circuit; that is, the layout of the N-type isolation regions 108 and 208 on the P-type substrate 100 can be automatically determined. Consequently, manual designing work is unnecessary and artificial mistakes can be prevented.

Since the supply potential is applied through the N-type wells 104 and 204 to the N-type isolation region 108 and 208 and the supply potential is applied to the surfaces of the well walls 108b and 208b at a plurality of positions, potential distributions in the N-type isolation regions 108 and 208 are substantially uniform, which enhances the electrical isolation effect of the N-type isolation regions 108 and 208.

Figure 12:
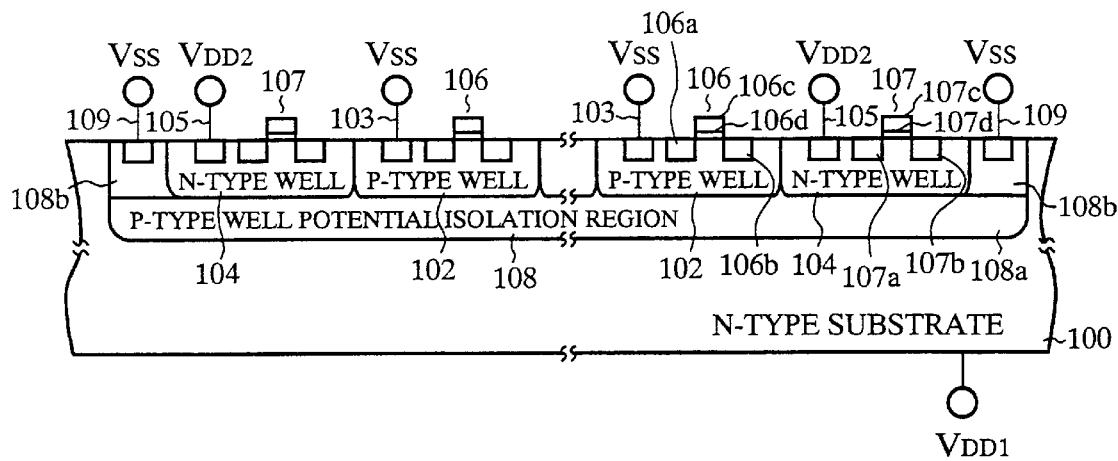
FIG. 12 is a typical sectional view of an essential part of a first logic circuit forming region 101 in a semiconductor IC device with built-in DRAM in a modification of the first embodiment.
Figure 13:
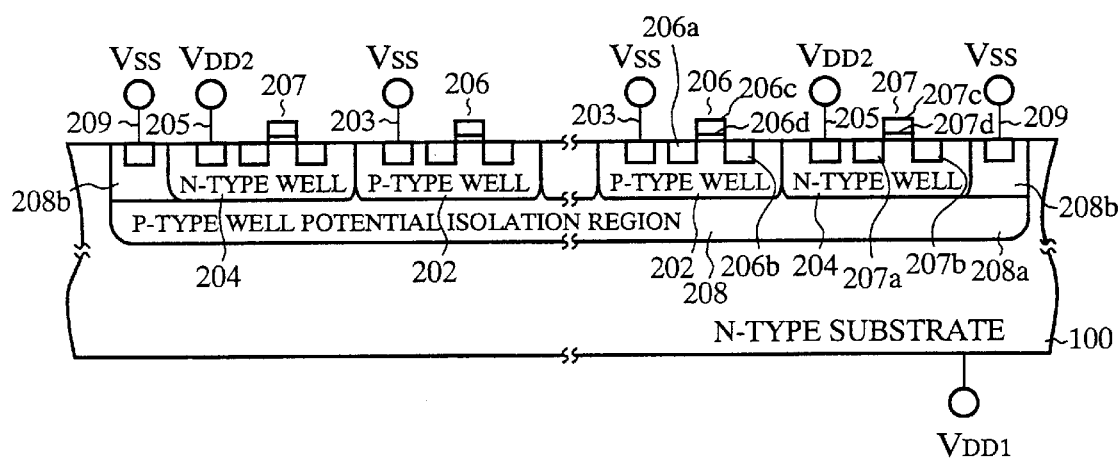
FIG. 13 is a typical sectional view of an essential part of a second logic circuit forming region 201 in the semiconductor IC device with built-in DRAM in the modification of the first embodiment.
Figure 14:
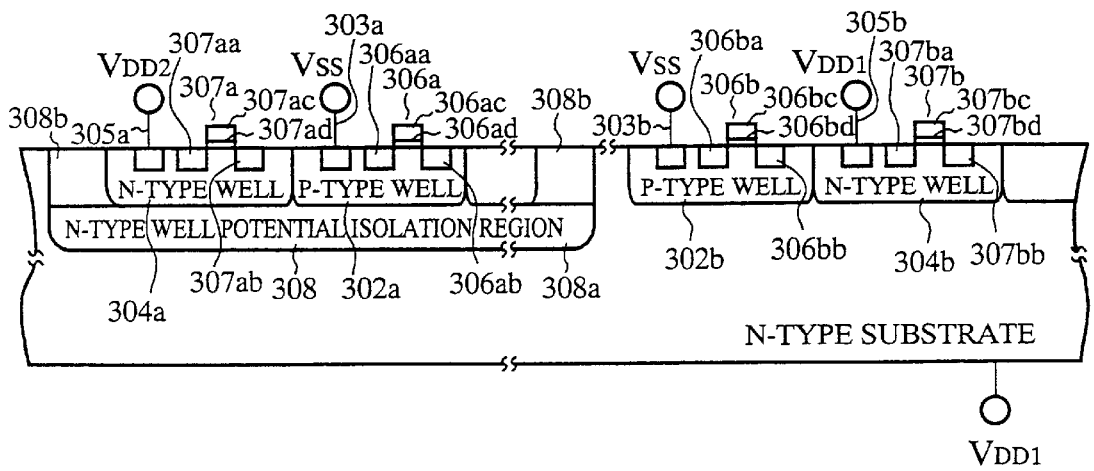
FIG. 14 is a typical sectional view of an essential part of a memory circuit forming region 301 in the semiconductor IC device with built-in DRAM in the modification of the first embodiment.

Although the first embodiment employs the P-type semiconductor substrate, an N-type semiconductor substrate may be used for the same effect. If an N-type semiconductor substrate is employed, the first logic circuit forming region 101, the second logic circuit forming region 201 and the memory circuit forming region 301 have structures as shown in FIGS. 12, 13 and 14 in typical sectional views.

If an N-type semiconductor substrate 100 is employed, a first supply potential VDD1 (in the first embodiment, the first supply potential is, for example, 6 V generated by a substrate potential generating circuit formed in the memory circuit forming region 301) is applied to the N-type semiconductor substrate 100, a ground potential VSS (for example, 0 V) is applied to the P-type wells 102 formed in the first logic circuit forming region 101, a second supply potential VDD2 (for example, 5 V) is applied to N-type wells 104 formed in the first logic circuit forming region 101, the ground potential VSS (for example, 0 V) is applied to P-type wells 202 formed in the second logic circuit forming region 201, the second supply potential VDD2 (for example, 5 V) is applied to N-type wells 204 formed in the second logic circuit forming region 201, the ground potential VSS (for example, 0 V) is applied to P-type wells 302a and 302b formed in the memory circuit forming region 301, the second supply potential VDD2 (for example, 5 V) is applied to N-type wells 304a formed in the memory circuit forming region 301, and the first supply potential VDD1 (for example, 6) is applied to N-type wells 304b formed in the memory circuit forming region 301.

Mask pattern data can be produced for the semi-conductor IC device with built-in DRAM thus constructed by the procedures represented by flow charts in FIGS. 1 and 2.

Second Embodiment

FIGS. 15 to 18 illustrate a second embodiment of the present invention. The second embodiment differs from the first embodiment only in that a supply potential is applied to N-type isolation regions 108 and 208 by a method different from that by which the supply potential is applied to the N-type isolation regions 108 and 208 in the first embodiment, and an isolation region pattern is produced by isolation region pattern producing step ST4 different from that in the first embodiment.

Therefore, only particulars of the second embodiment different from those of the first embodiment will be described below, in which parts like or corresponding to those of the first embodiment are designated by the same reference characters.

A method of applying the supply potential to the N-type isolation regions 108 and 208 of the semiconductor IC device with built-in DRAM in the second embodiment will be described with reference to FIG. 15.

Figure 15:
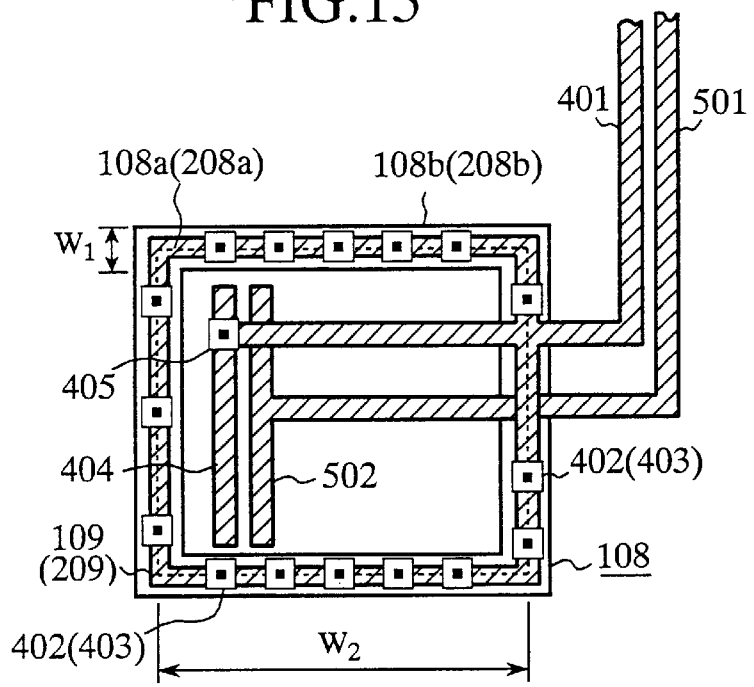
FIG. 15 is a plan view of an essential part of a semiconductor IC device in a second embodiment according to the present invention.

FIG. 15 shows the relation between the N-type isolation region 108 (208) formed in a first logic circuit forming region 101 (second logic circuit forming region 201) and a power line 109 (209) for applying a supply potential VDD (5 V in the second embodiment). The supply potential is applied to the N-type isolation regions 108 and 208 by methods based on the same idea, and hence only a method of applying the supply potential to the N-type isolation region 108 will be described for simplicity.

Referring to FIG. 15, the N-type isolation region 108 has an N-type bottom well 108a underlying P-type wells 102 and N-type wells 104 in the entire first logic circuit forming region 101 of a P-type substrate 100, and an N-type well wall 108b surrounding a first logic circuit formed in the first logic circuit forming region A 101 and extending from the surface of the P-type substrate 100 to the surface of the bottom well 108a. The periphery of the well wall 108b is outside the periphery of the bottom well 108a.

A power line layer 401 of, for example, aluminum (only part thereof is shown in FIG. 15) is formed in an insulating layer formed on the P-type substrate 100, and is connected to a power supply pad to apply a supply potential VDD (5 V in the second embodiment) to the semiconductor IC device by an external power supply. The power line layer 401 is a wiring layer for applying the supply potential VDD to first and second circuits and a memory circuit. The power line layer 401 is connected electrically to a plurality of power lines of a secondary power line layer 404 formed in the first logic circuit forming region 101 to apply the supply potential to the first logic circuit. In the second embodiment, the power line layer 404 of aluminum is formed in a layer separate from the power line layer 401 and the power lines of the secondary power line layer 404 are connected electrically through contact cells 405 to the power line layer 401.

A power line 109 is formed on and opposite to the surface of the well wall 108b of the N-type isolation region 108 so as to surround the first logic circuit, and is connected electrically to the power line layer 401. In the second embodiment, the power line 109 is formed of aluminum integrally with the power line layer 401. The power line 109 is connected electrically to the surface of the well wall 108b through a plurality of contact cells 402 arranged at predetermined intervals. The contact cells 402 are formed in contact holes formed in an insulating layer formed between the surface of the P-type substrate 100 and the power line 109 of the power line layer 401.

A grounding line layer 501 (only part thereof is shown in FIG. 15) is formed on an insulating layer formed on the P-type substrate 100 and is connected to a grounding pad to apply a ground potential VSS (0 V in the second embodiment) to the semiconductor IC device. In the second embodiment, the grounding line layer 501 is an aluminum layer formed integrally with the secondary power line layer 404 separate from the power line layer 401. The ground potential VSS is applied through the grounding line layer 501 to the first and the second circuit and the memory circuit. The grounding line layer 501 is connected electrically to a plurality of secondary grounding lines of a secondary grounding line layer 502 formed in the first logic circuit forming region 101 to apply the supply potential to the first logic circuit. In the second embodiment, the secondary grounding line layer 502 is an aluminum layer formed integrally with the secondary power line layer 404 separate from the poser line layer 401. Indicated at W1 is the width of the well wall 108b and at W2 is the width of the bottom well 108a.

In the semiconductor IC device with built-in DRAM thus constructed, the supply potential VDD is applied through the power line layer 401, the contact cells 405 and the secondary power line layer 404 to the N-type wells 104, and through the power lines 109 and the plurality of contact cells 402 to the well wall 108b, so that the electrical isolating effect of the N-type isolation region 108 is enhanced.

A method of automatically producing mask pattern data for forming the bottom wells 108a and 208a and the well walls 108b and 208b of the N-type isolation regions 108 and 208 in the first logic circuit forming region 101 and the second logic circuit forming region 201 of the semiconductor IC device with built-in DRAM shown in FIG. 15, and a mask pattern data producing apparatus therefor will be described with reference to FIG. 16.

Figure 16:
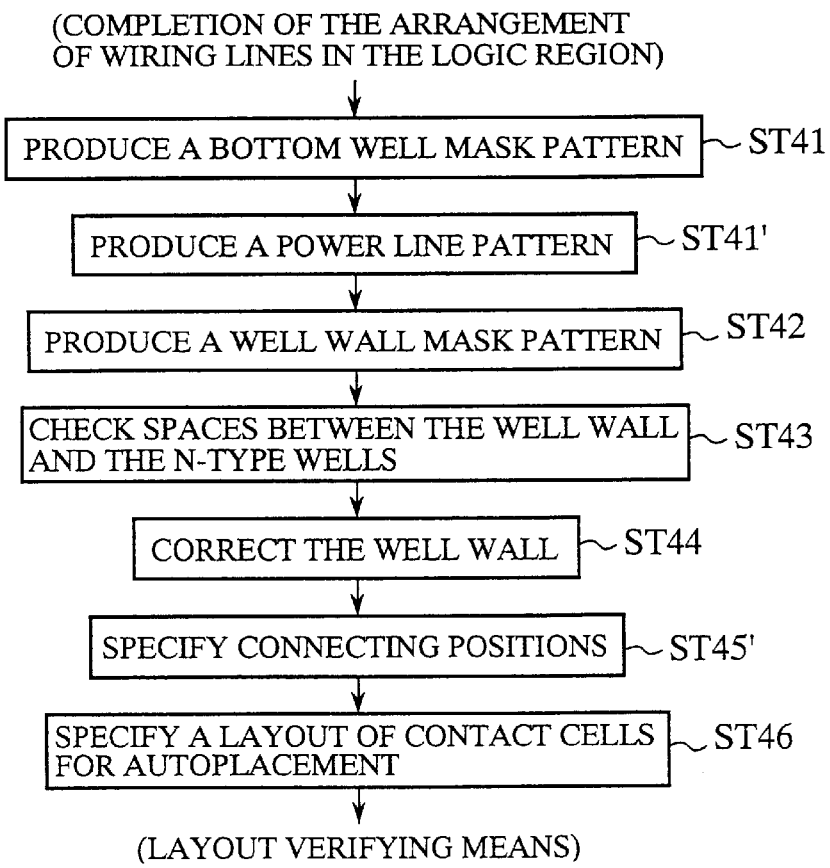
FIG. 16 is a flow chart of a procedure to be carried out by a mask pattern data producing apparatus in a second embodiment according to the present invention.

FIG. 16 is a flow chart of a procedure to be executed in isolation region pattern producing step ST4 of the procedure shown in FIG. 1 by the mask pattern data producing apparatus. Referring to FIG. 16, in bottom well mask pattern producing step ST41 for automatically producing mask pattern data for forming the bottom wells 108a and 208a of the N-type isolation regions 108 and 208, a bottom well mask pattern producing means produces a mask pattern for forming the bottom wells 108a and 208a of plane shapes of sizes slightly greater than those of the plane shapes of the first logic circuit forming region 101 and the second logic circuit forming region 201 on the basis of information about the first logic circuit forming region 101 and the second logic circuit forming region 201 specified in region specifying step ST1.

In power line pattern producing step ST41', a power line pattern producing means produces a mask pattern for forming the power lines 109 and 209 in plane shapes surrounding the first and the second logic circuit and slightly larger than the plane shapes of the first logic circuit forming region 101 and the second logic circuit forming region 201 on the basis of information about the peripheral shapes of the bottom wells 108a and 208a of a mask pattern for forming the bottom wells 108a and 208a produced by a bottom well mask pattern producing means. This mask pattern is combined with the mask pattern for forming the power line layer 401.

In well wall mask pattern producing step ST42 for automatically producing a mask pattern for forming the well walls 108b and 208b in the N-type isolation regions 108 and 208, a well wall mask pattern producing means executes calculations by using information about the power lines 109 and 209 of the mask pattern for forming the power lines 109 and 209 obtained in power line pattern producing step ST41' to produce a mask pattern for forming the well walls 108b and 208b having plane shapes overlapping parts of the plane shapes of the bottom wells 108a and 208a projecting from the peripheries of the first logic circuit forming region 101 and the second logic circuit forming region 201, and slightly greater than the plane shapes of the bottom wells 108a and 208a.

In space checking step ST43, spaces between the plane shape of the mask pattern for forming the well wall 108b produced in well wall mask pattern producing step ST42, and the plane shapes of all the N-type wells 104 formed in the first logic circuit forming region 101 are checked, if the spaces is greater than zero and less than a predetermined value (a value corresponding to a minimum width of the component elements of the first logic circuit), graphic data is provided as correction information, spaces between the plane shape of the mask pattern for forming the well wall 208b produced in well wall mask pattern producing step ST42, and the plane shapes of all the N-type wells 204 formed in the second logic circuit forming region 201 are checked and, if the spaces is greater than zero and less than a predetermined value (a value corresponding to a minimum width of the component elements of the second logic circuit), graphic data is provided as correction information. A space checking means of the autoplacement and autorouting apparatus executes space checking step ST43.

In well wall pattern correcting step ST44, the widths of the well walls 108b and 208b specified in the well wall pattern for forming well walls 108b and 208b produce in well wall mask pattern producing step ST42 are increased according to correction information to produce a mask pattern for forming the corrected well walls 108b and 208b automatically. A well wall pattern correcting means of the autoplacement and autorouting apparatus executes well wall pattern correcting step ST44. In the second embodiment, the well walls 108b and 208b are formed simultaneously with the N-type wells 104, 204, 304a and 304b and the well wall 308b formed in the first logic circuit forming region 101, the second logic circuit forming region 201 and the memory circuit forming region 301. Therefore, the mask pattern for forming the corrected well walls 108b and 208b is combined with a well mask pattern originally based on cell information 3 about the first and the second logic circuit and the memory circuit and information about the N-type wells 104, 204, 304a and 304b and a well wall 308b included in core information 3.

In connecting position specifying step ST45', connecting positions on the surfaces of the well walls 108b and 208b where the power lines 109 and 209 are connected to the well walls 108b and 208b are specified. A connecting position specifying means of the autoplacement and autorouting apparatus determines the connecting positions by operating information about the mask pattern for forming the corrected well walls 108b and 208b produced in well wall pattern correcting step ST44 and information about the positions of the power lines 109 and 209 specified in power line pattern producing step ST41'.

In contact cell autoplacement step ST46, a layout of contact cells for electrically connecting the surface of a P-type substrate 100 and the power line layer is specified automatically by a contact cell layout determining means of the autoplacement and autorouting apparatus.

A method of producing mask pattern data will be described below.

The second embodiment, similarly to the foregoing first embodiment, executes region specifying step ST1 shown in FIG. 1 using wafer processing information 1, logic information 2 describing the operations of the first and the second IC circuit and the memory circuit, cell information 3 about the first logic circuit, and core information 3 about the second logic circuit and the memory circuit to specify the positions of the first logic circuit forming region 101, the second logic circuit forming region 201 and the memory circuit forming region 301 for autoplacement, and executes cell layout specifying step ST2 shown in FIG. 1 to specify a layout of the component cells of the first logic circuit in the first logic circuit forming region 101 for autoplacement, and executes wiring line layout specifying step ST3 shown in FIG. 1 to specify a layout of all the wiring lines for autoplacement.

Figure 17:
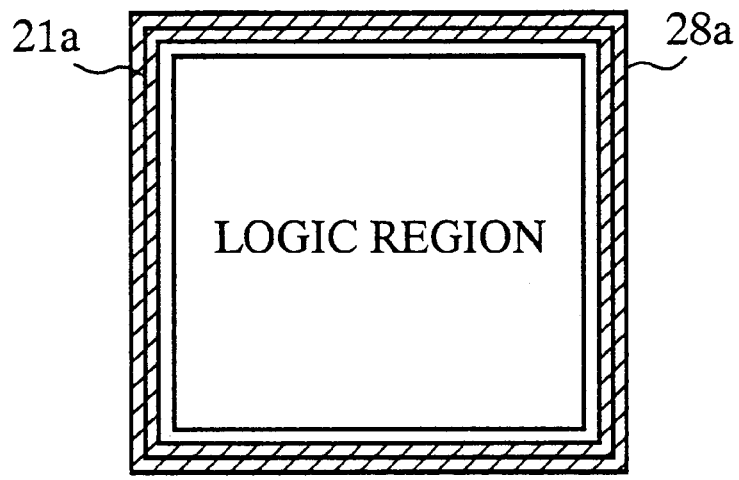
FIG. 17 is a view of assistance in explaining mask patterns for forming a bottom well and power lines in the second embodiment.
Figure 18:
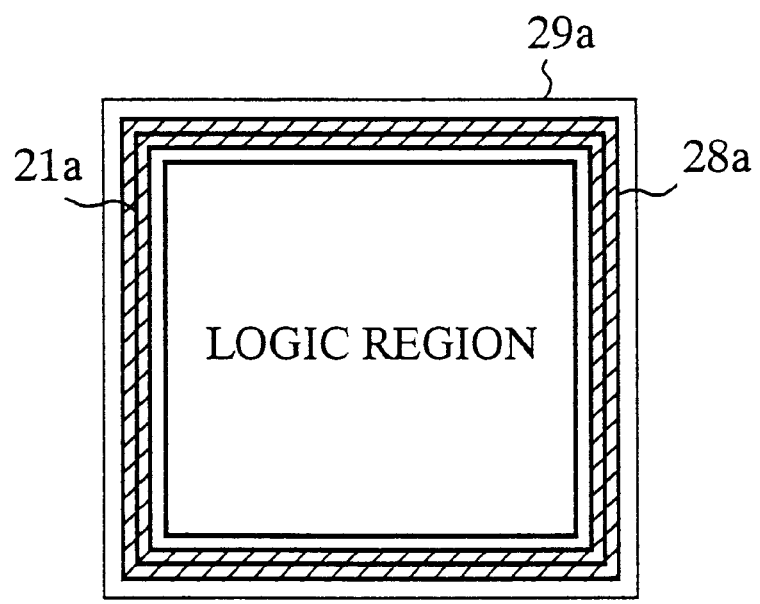
FIG. 18 is a view of assistance in explaining mask patterns for forming a bottom well, power lines and a well wall in the second embodiment.

In bottom well mask pattern producing step ST41 shown in FIG. 16, a Boolean operation of figure is executed to increase the information about the first logic circuit forming region 101 and the second logic circuit forming region 201 specified in region specifying step ST1 by a value conforming to design standard for wafer processing. A mask pattern 21 for forming the bottom wells 108a and 208a is determined on the basis of information about the increased region. The mask pattern 21, for example, is formed so that a region 21a on the surface of the P-type substrate 100 shown in FIG. 17 is irradiated with light.

Subsequently, arithmetic operations based on a specified width or a width corresponding wafer processing, using information about the peripheries of the bottom wells 108a and 208a in the mask pattern 21 for forming the bottom wells 108a and 208a produced in bottom well mask pattern producing step ST41 as a center line, and a mask pattern for forming the power lines 109 and 209 is produced by using information based on the results of the arithmetic operations (power line pattern producing step ST41' shown in FIG. 16). This mask pattern, for example, is formed so that a shaded region 28a shown in FIG. 17 is irradiated with light. The mask pattern for forming the power lines 109 and 209 is added to a mask pattern for forming the power line layer 401 located in wiring line layout specifying step ST3 to obtain a corrected mask pattern for forming the power line layer 401.

In well wall mask pattern producing step ST42, a mask pattern 22 is obtained by increasing information abut the power lines 109 and 209 in the mask pattern for forming the power lines 109 and 209 obtained in power line pattern producing step ST41' according to information about wafer processing. The mask patter 22, for example, is formed so that a region 29a (region between the innermost frame and the outermost frame in FIG. 18) is irradiated with light.

Spaces between the well wall 108b and the N-type wells 104 and the spaces between the well wall 208b and the N-type wells 204 are calculated by using information about the well walls 108b and 208b in the mask pattern 22 for forming the well walls 108b and 208b obtained in well wall mask pattern producing step ST42, and information about all the N-type wells 104 and 204 for forming the first and the second logic circuit originally included in the cell information 3 and the core information 3. The calculated spaces are compared with a predetermined value to obtain correcting information in graphic information (space checking step ST43 shown in FIG. 16). As shown by way of example in FIG. 11, if the space between the well wall 108b (208b) and the N-type well 104 (204) is less than the predetermined value, the graphic information, represents a plane pattern between the respective opposite sides of the well wall 108*b* (208*b*) and the N-type well 104 (204). The graphic information is added for correction to the information about the well walls 108*b* and 208*b* produced in well wall mask pattern producing step ST42 to obtain a mask pattern for forming the corrected well walls 108*b* and 208*b* (well wall pattern correcting step ST44 shown in FIG. 16).

A Boolean operation of figure is executed to add the information about the corrected well walls 108*b* and 208*b* of the mask pattern for forming the well walls 108*b* and 208*b*, and the information about the N-type wells 104 and 204, 304*a* and 304*b* and the well wall 308*b* originally included in the cell information 3 and the core information 3 about the first and the second logic circuit and the memory circuit to obtain a well mask pattern for simultaneously forming the well walls and the N-type wells.

Subsequently, connecting position specifying step ST45' is executed to specify connecting positions on the surfaces of the well walls 108*b* and 208*b* where the power lines 109 and 209 are connected to the well walls 108*b* and 208*b* by operating information about the mask pattern for forming the corrected well walls 108*b* and 208*b* produced in well wall pattern correcting step ST44 and information about the positions of the power lines 109 and 209 specified in power line pattern producing step ST41'. Then, contact cell autoplacement step ST46 is executed to arrange the contact cells 402 and 403 for electrically connecting the surface of the P-type substrate 100 and the power line layer at the connecting positions specified in the connecting position specifying step ST45' on the basis of information about the contact cells 402 and 403.

The layout is verified in layout verifying step ST5 shown in FIG. 1 and, if there is no any problem in the layout, the layout data obtained in the foregoing steps (naturally, including the data on the mask pattern for forming the N-type isolation regions 108 and 208) is stored in a layout storage means to use the layout data for fabricating the semiconductor IC device with built-in DRAM.

Thus the second embodiment, similarly to the first embodiment, is capable of designing the mask pattern for forming the N-type isolation regions 108 and 208 by the autoplacement and autorouting apparatus; that is, the layout of the N-type isolation regions 108 and 208 on the P-type substrate 100 can be automatically determined. Consequently, manual designing work is unnecessary and artificial mistakes can be prevented.

Since the supply potential is applied through the N-type wells 104 and 204 to the N-type isolation region 108 and 208 and the supply potential is applied to the surfaces of the well walls 108*b* and 208*b* at a plurality of positions through the power lines 109 and 209 disposed opposite to the surfaces of the well walls 108*b* and 208*b*, potential distributions in the N-type isolation regions 108 and 208 are substantially uniform, which enhances the electrical isolation effect of the N-type isolation regions 108 and 208.

Third Embodiment

FIGS. 19 to 22 illustrate a third embodiment of the present invention. The third embodiment differs from the first embodiment only in that an isolation region pattern is produced by isolation region pattern producing step ST4 different from that in the first embodiment.

Therefore, only particulars of the third embodiment different from those of the first embodiment, particularly, well wall mask pattern producing step ST42 will be described below with reference to FIGS. 19 to 22, in which parts like or corresponding to those of the first embodiment are designated by the same reference characters.

Figure 19:
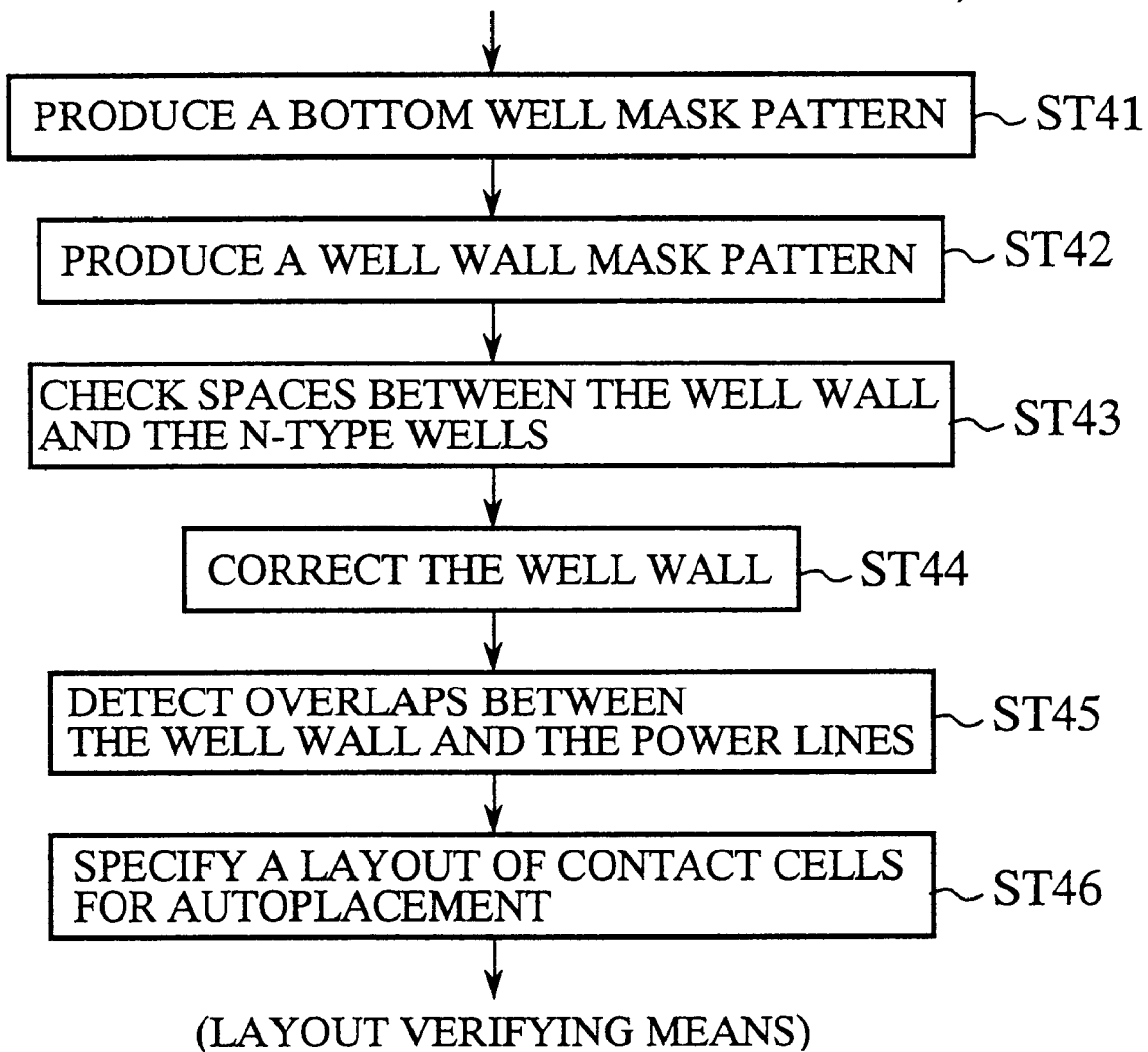
FIG. 19 is a flow chart of an essential procedure to be carried out by a mask pattern data producing apparatus in a third embodiment according to the present invention.

Referring to FIG. 19, well wall mask pattern producing step ST42 is executed to produce automatically a mask pattern for forming well walls 108*b* and 208*b* in N-type isolation regions 108 and 208. A well wall mask pattern producing means operates information about a first logic circuit forming region 101, a second logic circuit forming region 201 and a memory circuit forming region 301 specified in region specifying step ST1 to produce a mask pattern for forming the well walls 108*b* and 208*b* having plane shapes corresponding to regions outside the first logic circuit forming region 101, the second logic circuit forming region 201 and the memory circuit forming region 301.

A method of producing mask pattern data will be described below.

The third embodiment, similarly to the foregoing first embodiment, executes region specifying step ST1 shown in FIG. 1 using wafer processing information 1, logic information 2 describing the operations of first and second IC circuits and a memory circuit, cell information 3 about a first logic circuit, and core information 3 about a second logic circuit and the memory circuit to specify the positions of the first logic circuit forming region 101, the second logic circuit forming region 201 and the memory circuit forming region 301 for autoplacement, and executes cell layout specifying step ST2 shown in FIG. 1 to specify a layout of the component cells of the first logic circuit in the first logic circuit forming region 101 for autoplacement, executes wiring line layout specifying step ST3 shown in FIG. 1 to specify a layout of all the wiring lines for autoplacement, and executes bottom well mask pattern producing step ST41 shown in FIG. 2 (the same as bottom well mask pattern producing step ST41 shown in FIG. 19) to obtain a mask pattern 21 for forming bottom wells 108*a* and 208*a*.

In well wall mask pattern producing step ST42 shown in FIG. 19, information about the first logic circuit forming region 101, the second logic circuit forming region 201 and the memory circuit forming region 301 specified in region specifying step ST1 is operated to produce a mask is pattern 22 for forming the well walls 108*b* and 208*b* having plane shapes corresponding to regions outside the first logic circuit forming region 101, the second logic circuit forming region 201 and the memory circuit forming region 301; that is, the mask pattern 22 for forming the well walls 108*b* and 208*b* is a reversal of the plane shape of the first logic circuit forming region 101, the second logic circuit forming region 201 and the memory circuit forming region 301. For example, the mask pattern 22 is formed so that a shaded region 21*a* is irradiated with light.

The third embodiment, similarly to the first embodiment, executes space checking step ST43 to obtain graphic data as correction information, executes well wall pattern correcting step ST44 to obtain a mask pattern for forming the corrected well walls 108*b* and 208*b*, and obtains a combined mask pattern for simultaneously forming the well walls and the N-type wells.

In overlap detecting step ST45, a logical AND operation between information about the corrected well walls 108*b* and 208*b* of the mask pattern for forming the corrected well walls 108*b* and 208*b* produced in well wall pattern correcting step ST44 and information about a power line layout specified in wiring line layout specifying step ST3 to detect overlaps between the well walls 108*b* and 208*b*, and the power lines. Contact cells 402 and 403 are arranged automatically at positions corresponding to overlaps detected in overlap detecting step ST45 according to information about contact cells for electrically connecting the surface of a P-type substrate 100 and a power line layer.

Figure 20:
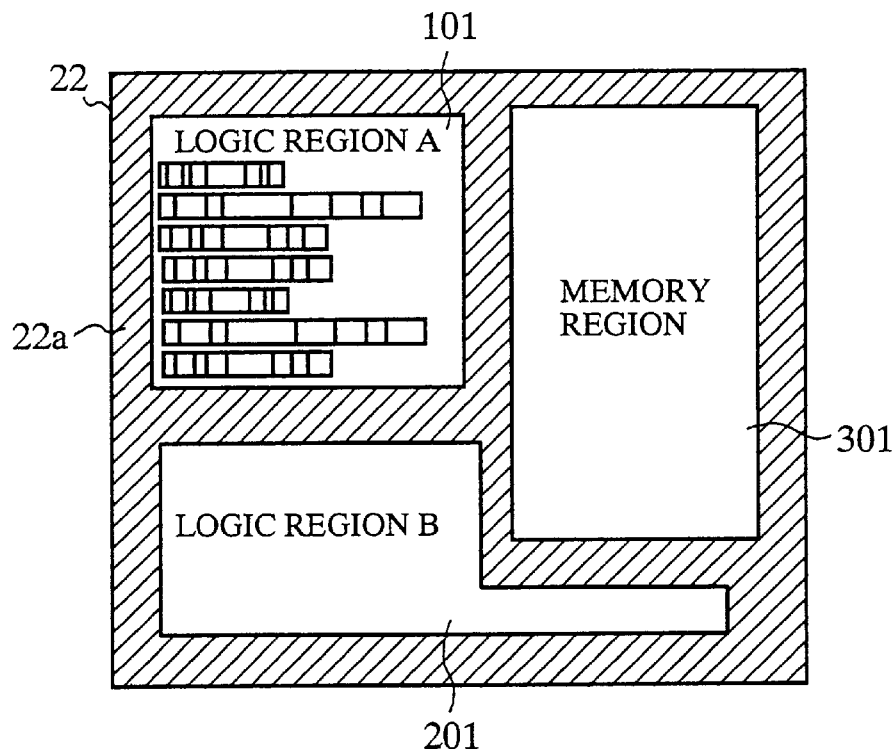
FIG. 20 is a view of assistance in explaining a mask pattern for forming well walls in the third embodiment.
Figure 21:
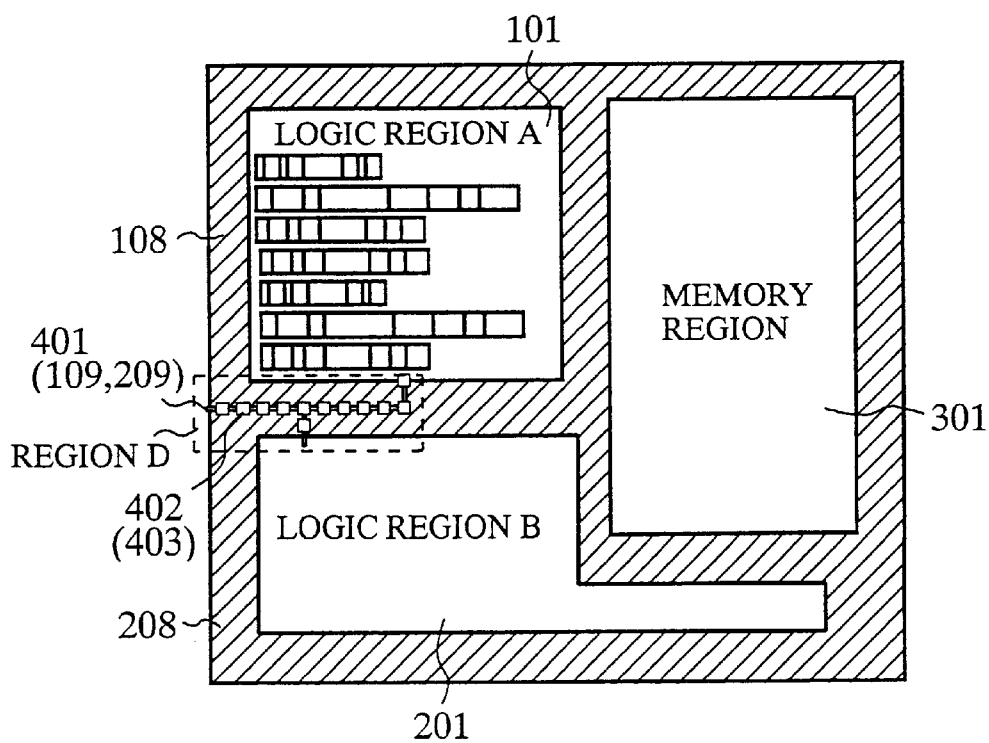
FIG. 21 is a schematic plan view of an essential part of a semiconductor IC device in the third embodiment according to the present invention.
Figure 22:
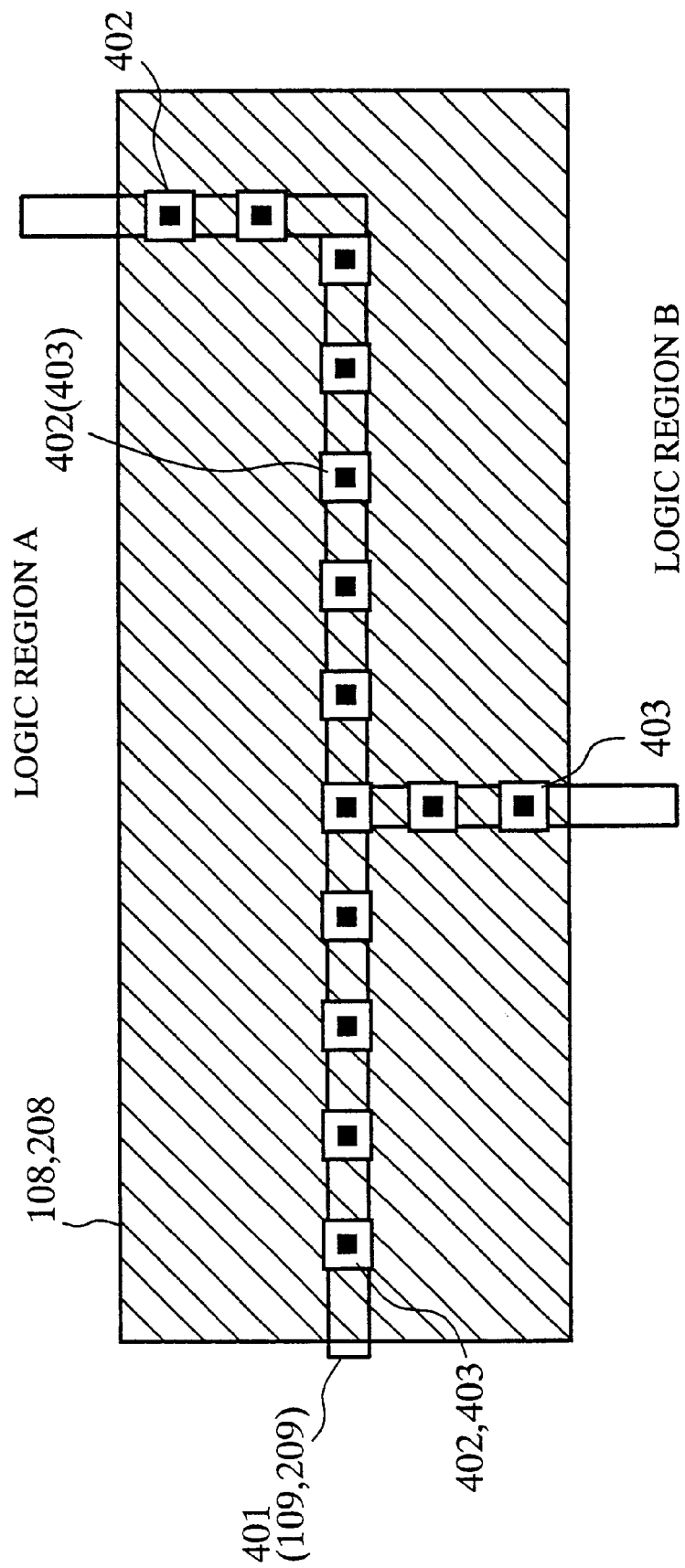
FIG. 22 is an enlarged view of a region D in FIG. 21.

Thus, a power line layer 401 having the power lines 109 and 209 are connected electrically to the well walls 108*b* and 208*b* as shown in FIGS. 19 and 20.

The layout is verified in layout verifying step ST5 shown in FIG. 1 and, if there is no any problem in the layout, the layout data obtained in the foregoing steps (naturally, including the data on the mask pattern for forming the N-type isolation regions 108 and 208) is stored in a layout storage means to use the layout data for fabricating the semiconductor IC device with built-in DRAM.

Thus, the effects of the third embodiment are similar to those of the first embodiment.

As is apparent from the foregoing description, according to the present invention, the well wall of the second type of conduction surrounding the first IC formed in the first IC forming region and extending from the surface of the semiconductor substrate to the bottom wells is formed on the basis of information about the bottom well in the mask pattern produced by the bottom well mask pattern producing means, and hence the mask pattern for forming the well wall can be automatically produce. Therefore, Load on designing work is reduced, artificial mistakes can be prevented, and manufacturing costs including labor costs can be reduced.

According to the present invention, the semiconductor IC device with built-in DRAM comprises the well potential isolation region having the bottom well of the second type of conduction underlying the first well regions in the entire first IC forming region and the well wall of the second type of conduction surrounding the first IC formed in the first IC forming region and extending from the surface of the semiconductor substrate to the bottom well, the first wiring layer electrically connected to the surfaces of the first well regions to apply the first potential to the first well regions, the second wiring layer electrically connected to the surfaces of the second well regions to apply the second potential different from the first potential to the second well regions, and the third wiring layer electrically connected to the surface of the well potential isolation region to apply a third potential to the well potential isolation region to reverse-bias the PN junction of the well potential isolation region and the semiconductor substrate. Accordingly, the isolation effect of the well potential isolation region is further enhanced.

What is claimed is:

1. A mask pattern data producing apparatus comprising:
   means for specifying a first IC forming region and a second IC forming region on a surface of a semiconductor substrate of a first conduction type;
   MOS transistors of a second conduction type formed in first well regions of the first IC forming region for charging at a first substrate potential, said first well regions being of a first conduction type;
   MOS transistors of the second conduction type formed in second well regions of the second IC forming region for charging at a second substrate potential that is different from the first substrate potential, said second well regions being of the first conduction type;
   means for producing a first mask pattern for forming a bottom well of the second type of conduction under the first well regions in the entire first IC forming region of the semiconductor substrate; and
   means for producing a second mask pattern for forming a well wall of the second type of conduction surrounding a first IC formed in the first IC forming region and extending from the surface of the semiconductor substrate to the bottom well on the basis of information about the first IC forming region specified by the means for specifying and information about the bottom well corresponding to the mask pattern producing by the means for producing a first mask pattern.

2. A mask pattern data producing apparatus comprising:
   means for specifying a first IC forming region having a first IC formed therein and a second IC forming region having a second IC is formed therein;
   a semiconductor substrate of a first conduction type having the first IC forming region and the second IC forming region on a surface thereof;
   said first IC comprising a plurality of cells having a predetermined logic value, wherein at least some of the cells are formed of MOS transistors of a second conductor type formed in first well regions of the first conduction type for charging at a first substrate potential, and wherein at least part of the second IC is formed of MOS transistors of the second conduction type formed in second well regions of the first conduction type for charging at a second substrate potential that is different from the first substrate potential;
   means for specifying a layout for the plurality of cells in the first IC forming region based on logical information describing the operations of the first IC;
   means for specifying wiring routes in the first IC forming region based on logical information describing the operations of the first IC and cell information about the plurality of cells;
   means for producing a first mask pattern for forming a bottom well of the second conduction type under the first well regions in the entire first IC forming region of the semiconductor substrate; and
   means for producing a second mask pattern for forming a well wall of the second conduction type surrounding the first IC and extending from the surface of the semiconductor substrate to the bottom well based on information about the first IC forming region specified by said means for specifying a first IC forming region and information about the bottom well corresponding to the mask pattern produced.

3. The mask pattern data producing apparatus according to claim 1, wherein the mask pattern for forming the bottom wells is produced based on information about the first IC forming region and information about design standards for wafer processing so that the plane shape of the bottom well is greater by a design standard value than the plane shape of the first IC forming region, and
   the mask pattern for forming the well wall is produced based on information about the mask pattern for forming the bottom well and information about the first IC forming region so that an inner periphery thereof corresponds to an outer periphery of the first IC forming region and an outer periphery thereof corresponds to an outer periphery of the bottom well.

4. The mask pattern data producing apparatus according to claim 1, wherein the mask pattern for forming the well wall is produced based on information about the first and the second IC forming regions.

5. The mask pattern data producing apparatus according to claim 1, wherein MOS transistors of the first conduction type are formed in third well regions of the second conduction type to which a third substrate potential different from the first and the second substrate potentials is applied, and
   said means for producing a second mask pattern compares a space between the well wall and the third well regions with a predetermined value, adds a correcting wall corresponding to correcting information determined by the comparison to the well wall, and produces a mask pattern for forming a corrected well wall.

6. The mask pattern data producing apparatus according to claim 1, wherein said means for producing a second mask pattern produces a mask pattern for forming a potential applying line disposed opposite to the surface of the well wall to apply a potential for reverse-biasing a PN junction of the well regions and the semiconductor substrate, and specifies a layout of a plurality of contact cells for electrically connecting the potential applying line to the surface of the well wall at a plurality of positions.

7. A semiconductor IC device comprising:
a semiconductor substrate of a first type of conduction having on a surface thereof a first IC forming region in which a first IC is formed and a second IC forming region in which a second IC is formed;
first well regions of the first type of conduction formed in the first IC forming region;
MOS transistors of a second type of conduction formed as components of the first IC in the first well regions;
second well regions of the first type of conduction formed in the second IC forming region;
MOS transistors of the second type of conduction formed as components of the second IC in the second well regions;
a well potential isolation region having a bottom well of the second type of conduction underlying the first well regions in the entire first IC forming region of the semiconductor substrate, and a well wall surrounding the first IC and extending from the surface of the semiconductor substrate to the bottom well;
a first wiring layer formed on the surface of the semiconductor substrate and electrically connected to surfaces of the first well regions to charge the first well regions at a ground potential;
a second wiring layer formed on the surface of the semiconductor substrate and electrically connected to surfaces of the second well regions to charge the second well regions at a negative potential; and
a third wiring layer formed on the surface of the semiconductor substrate and electrically connected to a surface of the well potential isolation region to charge the well potential isolation region at a positive potential.

8. The semiconductor IC device according to claim 7, wherein the third wiring layer is formed over a surface of the well potential isolation region, and has a connecting line electrically connected to the surface of the well potential isolation region at a plurality of positions on the same surface.

9. The semiconductor IC device according to claim 8, wherein the connecting line of the third wiring layer surrounds the first IC circuit, and is electrically connected to the surface of the well potential isolation region at a plurality of positions on the periphery of the first IC.

10. The semiconductor IC device according to claim 7, wherein the first IC is either a logic circuit designed and disposed on the basis of cells having a predetermined logic value, or a logic circuit designed and placed on the basis of a core managed as design resources, and the second IC is a memory circuit.

11. The semiconductor IC device according to claim 7, wherein the first IC forming region is a logic circuit forming region including the first IC as a logic circuit, the second IC forming region is a memory circuit forming region including the second IC as a memory circuit, the first type of conduction is P-type, and the second type of conduction is N-type.

12. The semiconductor IC device according to claim 11, further comprising:
N-type third well regions formed in the logic circuit forming region;
P-type MOS transistors formed in the third well region as components of the logic circuit;
N-type fourth well regions formed in the memory circuit forming region;
P-type MOS transistors formed in the fourth well regions as components of the memory circuit;
a fourth wiring layer formed on the surface of the semiconductor substrate and electrically connected to the surfaces of the third well regions to charge the third well regions at a positive potential; and
a fifth wiring layer formed on the surface of the semiconductor substrate and electrically connected to the surfaces of the fourth well regions to charge the fourth well regions at a positive potential,
wherein the bottom well underlies the third well region.

13. The semiconductor IC device according to claim 11, wherein the logic circuit forming region includes a first logic circuit forming sub-region in which a first logic circuit forming sub-region designed and placed on the basis of a core managed as design resources, and said IC device further comprising:
P-type fifth well regions formed in the first logic circuit forming sub-region;
N-type first MOS transistors formed in the fifth well regions as components of the first logic circuit;
N-type sixth well regions formed in the first logic circuit forming sub-region;
P-type second MOS transistors formed in the third well regions as components of the first logic circuit;
P-type seventh well regions formed in the memory circuit forming region;
N-type third MOS transistors formed in the seventh well regions as components of the memory circuit;
N-type eighth well regions formed in the memory circuit forming region;
P-type fourth MOS transistors formed in the eighth well regions as components of the memory circuit;
P-type ninth well regions formed in the second logic circuit forming sub-region;
N-type fifth MOS transistors formed in the ninth well regions as components of a second logic circuit;
N-type tenth well regions formed in the second logic circuit forming sub-region; and
P-type sixth MOS transistors formed in the tenth well regions as components of the second logic circuit,
and wherein the well potential isolation region includes:
a first well potential isolation sub-region having an N-type first bottom well underlying the fifth and the sixth well regions in the entire first logic circuit forming sub-region of the semiconductor substrate, and an N-type first well wall surrounding the first logic circuit formed in the first logic circuit forming sub-region and extending from the surface of the semiconductor substrate to the first bottom well; and
a second well potential isolation sub-region having an N-type second bottom well underlying the ninth and the tenth well regions in the entire second logic circuit forming sub-region of the semiconductor substrate, and an N-type second well wall surrounding the second logic circuit formed in the second logic circuit forming sub-region and extending from the surface of the semiconductor substrate to the second bottom well;

a first wiring layer formed on the surface of the semiconductor substrate and electrically connected to the surfaces of the first well regions to charge the fifth well regions at a ground potential;

a second wiring layer formed on the surface of the semiconductor substrate and electrically connected to the surfaces of the second well regions to charge the seventh well regions at a negative potential;

a third wiring layer formed on the surface of the semiconductor substrate and electrically connected to the surfaces of the sixth well regions to charge the third well regions at a positive potential;

a fourth wiring layer formed on the surface of the semiconductor substrate and electrically connected to the surfaces of the eighth well regions to charge the fourth well regions at a positive potential;

a fifth wiring layer formed on the surface of the semiconductor substrate and electrically connected to the surfaces of the ninth well regions to charge the fifth well regions at a ground potential;

a sixth wiring layer formed on the surface of the semiconductor substrate and electrically connected to the surfaces of the tenth well regions to charge the second well regions at a positive potential;

a seventh wiring layer formed on the surface of the semiconductor substrate and electrically connected to the surface of the first well potential isolation sub-region to charge the first well potential isolation sub-region at a positive potential; and an eighth wiring layer formed on the surface of the semiconductor substrate and electrically connected to the surface of the second well potential isolation sub-region to charge the second well potential isolation sub-region at a positive potential.

* * * * *